US012689841B2

(12) United States Patent
Uchida

(10) Patent No.: US 12,689,841 B2
(45) Date of Patent: Jul. 21, 2026

(54) IMAGE SENSOR AND ELECTRONIC DEVICE

(71) Applicant: SONY SEMICONDUCTOR SOLUTIONS CORPORATION, Kanagawa (JP)

(72) Inventor: Tetsuya Uchida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 592 days.

(21) Appl. No.: 17/053,208

(22) PCT Filed: May 7, 2019

(86) PCT No.: PCT/JP2019/018212
§ 371 (c)(1),
(2) Date: Nov. 5, 2020

(87) PCT Pub. No.: WO2019/220945
PCT Pub. Date: Nov. 21, 2019

(65) Prior Publication Data
US 2021/0136310 A1 May 6, 2021

(30) Foreign Application Priority Data

May 18, 2018 (JP) ................................. 2018-095904

(51) Int. Cl.
*H04N 25/77* (2023.01)
*H10F 39/00* (2025.01)
(52) U.S. Cl.
CPC ......... *H04N 25/77* (2023.01); *H10F 39/8027* (2025.01); *H10F 39/8037* (2025.01)
(58) Field of Classification Search
CPC ........... H01L 27/1463; H01L 27/14641; H01L 27/14638; H01L 27/14607; H01L 27/14612; H01L 27/14603; H04N 25/77
See application file for complete search history.

(56) References Cited

U.S. PATENT DOCUMENTS

2007/0045513 A1* 3/2007 Lee ..................... H01L 27/1463
250/208.1
2007/0128954 A1 6/2007 Itonaga
(Continued)

FOREIGN PATENT DOCUMENTS

| CN | 102194843 A | 9/2011 |
| CN | 102201423 A | 9/2011 |

(Continued)

OTHER PUBLICATIONS

WO2016143531A1_Description_20230804_0933 (English machine translation) (Year: 2016).*

(Continued)

*Primary Examiner* — Brian Turner
(74) *Attorney, Agent, or Firm* — SHERIDAN ROSS P.C.

(57) ABSTRACT

The present technology relates to an image sensor and an electronic device that can reduce an FD capacity. An image sensor includes a substrate, a first pixel including a first photoelectric conversion area provided in the substrate, a second pixel including a second photoelectric conversion area adjacent to the first photoelectric conversion area and provided in the substrate, a trench provided in the substrate between the first photoelectric conversion area and the second photoelectric conversion area, a first area included in the first pixel, a second area included in the second pixel, and a third area in contact with the first area, the second area, and the trench. The present technology can be applied to, for example, a CMOS image sensor.

16 Claims, 24 Drawing Sheets

(56)  References Cited

U.S. PATENT DOCUMENTS

| 2008/0217718 | A1 |  | 9/2008 | Mauritzson |
| 2010/0090095 | A1 |  | 4/2010 | Han |
| 2011/0220976 | A1 | * | 9/2011 | Iida ................... H01L 27/1463 |
|  |  |  |  | 257/E31.001 |
| 2012/0009720 | A1 |  | 1/2012 | Shim |
| 2013/0037900 | A1 | * | 2/2013 | Abe ................. H01L 27/14638 |
|  |  |  |  | 438/57 |
| 2013/0307040 | A1 |  | 11/2013 | Ahn et al. |
| 2014/0131779 | A1 |  | 5/2014 | Takeda |
| 2014/0217474 | A1 |  | 8/2014 | Lee |
| 2014/0246707 | A1 | * | 9/2014 | Koo ................. H10F 39/80373 |
|  |  |  |  | 257/230 |
| 2015/0002713 | A1 |  | 1/2015 | Nomura |
| 2015/0048427 | A1 |  | 2/2015 | Hu |
| 2015/0236058 | A1 |  | 8/2015 | Hu |
| 2016/0014353 | A1 | * | 1/2016 | Lee ..................... H04N 25/583 |
|  |  |  |  | 250/206 |
| 2016/0056200 | A1 |  | 2/2016 | Lee |
| 2016/0150169 | A1 |  | 5/2016 | Hynecek |
| 2016/0172394 | A1 |  | 6/2016 | Lee |
| 2016/0204143 | A1 | * | 7/2016 | Lee ..................... H01L 27/1463 |
|  |  |  |  | 257/446 |
| 2016/0204153 | A1 |  | 7/2016 | Tayanaka |
| 2017/0077155 | A1 | * | 3/2017 | Sano ..................... H04N 25/76 |
| 2017/0110500 | A1 |  | 4/2017 | Tayanaka |
| 2017/0125473 | A1 | * | 5/2017 | Wang ................ H01L 27/14689 |
| 2017/0200763 | A1 | * | 7/2017 | Wang ................ H01L 27/14643 |
| 2017/0207259 | A1 |  | 7/2017 | Yun |
| 2017/0373108 | A1 |  | 12/2017 | Hwangbo |
| 2018/0090534 | A1 |  | 3/2018 | Kim |
| 2018/0145101 | A1 |  | 5/2018 | Sano |
| 2018/0151609 | A1 | * | 5/2018 | Tai .......................... H10F 39/18 |
| 2018/0182806 | A1 | * | 6/2018 | Jin ................... H01L 27/14685 |
| 2018/0350854 | A1 | * | 12/2018 | Miura ................... H10K 39/32 |
| 2019/0043901 | A1 |  | 2/2019 | Honda et al. |
| 2020/0279877 | A1 | * | 9/2020 | Kim ..................... H10F 39/199 |

FOREIGN PATENT DOCUMENTS

| CN |  | 102917179 | A |  | 2/2013 |  |
| CN |  | 106663687 | A |  | 5/2017 |  |
| EP |  | 2216818 | A2 |  | 8/2010 |  |
| JP |  | 2010186818 | A |  | 8/2010 |  |
| JP |  | 2011-014808 |  |  | 1/2011 |  |
| JP |  | 2011003860 | A |  | 1/2011 |  |
| JP |  | 2011187857 | A |  | 9/2011 |  |
| JP |  | 2013041915 | A |  | 2/2013 |  |
| JP |  | 2014096490 | A |  | 5/2014 |  |
| JP |  | 2015-046477 |  |  | 3/2015 |  |
| JP |  | 2015177323 | A |  | 10/2015 |  |
| JP |  | 2015-233122 |  |  | 12/2015 |  |
| JP |  | 2016039315 | A |  | 3/2016 |  |
| KR |  | 20160008287 | A |  | 1/2016 |  |
| KR |  | 20170008733 | A |  | 1/2017 |  |
| KR |  | 20170124548 | A |  | 11/2017 |  |
| TW |  | 201535698 | A |  | 9/2015 |  |
| TW |  | 201545329 | A |  | 12/2015 |  |
| WO | WO-2014192576 | A1 |  | 12/2014 |  |
| WO | WO-2016143531 | A1 | * | 9/2016 | ....... H01L 21/76898 |
| WO | WO-2017061295 | A1 |  | 4/2017 |  |
| WO | WO-2017159361 | A1 |  | 9/2017 |  |
| WO | WO 2017/187957 |  |  | 11/2017 |  |

OTHER PUBLICATIONS

International Search Report and Written Opinion prepared by the Japanese Patent Office on Aug. 1, 2019, for International Application No. PCT/JP2019/018212.

* cited by examiner

IMAGE SENSOR AND ELECTRONIC DEVICE

CROSS REFERENCE TO RELATED APPLICATIONS

This application is a national stage application under 35 U.S.C. 371 and claims the benefit of PCT Application No. PCT/JP2019/018212 having an international filing date of 7 May 2019, which designated the United States, which PCT application claimed the benefit of Japanese Patent Application No. 2018-095904 filed 18 May 2018, the entire disclosures of each of which are incorporated herein by reference.

TECHNICAL FIELD

The present technology relates to an image sensor and an electronic device, such as an image sensor and an electronic device suitable for application when a predetermined transistor is shared by a plurality of pixels.

BACKGROUND ART

In the related art, a complementary metal oxide semiconductor (CMOS) image sensor provided in an imaging apparatus includes elements such as a photodiode and a transistor in each pixel. Further, a configuration including a deep trench isolation (DTI) that electrically isolates adjacent pixels from each other between the respective pixels has been proposed as a CMOS image sensor.

When the DTI is provided and a predetermined transistor is shared by a plurality of pixels, it is necessary for a floating diffusion (FD) area to be provided in each pixel and a plurality of FD areas to be electrically connected by wirings. Because a wire length becomes long due to the connection of the FD areas using wirings, an FD capacity is likely to increase. When the FD capacity increases, conversion efficiency is degraded, an output signal is decreased, and an S/N ratio is likely to deteriorate.

PTL 1 proposes that a contact that is electrically connected to both FD areas of adjacent pixels be formed so that the FD areas are electrically connected and an increase in an FD capacity is curbed.

CITATION LIST

Patent Literature

[PTL 1]
US Patent Application Publication No. 2017/0200763

SUMMARY

Technical Problem

According to 1, it is necessary for a large contact to be formed or a large FD area to be formed, in order to connect the FD areas of adjacent pixels and curb an increase in a contact resistance and in order for misalignment of contacts to be tolerated even when the misalignment of contacts occurs.

According to PTL 1, a reduction in a size of the contact or the FD areas is limited. It is desired to decrease the FD capacity, improve the conversion efficiency, and increase the S/N ratio.

The present technology has been made in view of such a situation, and makes it possible to increase an S/N ratio.

Solution to Problem

An image sensor according to an aspect of the present technology includes a substrate; a first pixel including a first photoelectric conversion area provided in the substrate; a second pixel including a second photoelectric conversion area adjacent to the first photoelectric conversion area and provided in the substrate; a trench provided in the substrate between the first photoelectric conversion area and the second photoelectric conversion area; a first area included in the first pixel; a second area included in the second pixel; and a third area in contact with the first area, the second area, and the trench.

An electronic device according to an aspect of the present technology includes an image sensor, the image sensor including; a substrate; a first pixel including a first photoelectric conversion area provided in the substrate; a second pixel including a second photoelectric conversion area adjacent to the first photoelectric conversion area and provided in the substrate; a trench provided in the substrate between the first photoelectric conversion area and the second photoelectric conversion area; a first area included in the first pixel; a second area included in the second pixel; and a third area in contact with the first area, the second area, and the trench.

An image sensor according to an aspect of the present technology includes a substrate; a first pixel including a first photoelectric conversion area provided in the substrate; a second pixel including a second photoelectric conversion area adjacent to the first photoelectric conversion area and provided in the substrate; a trench provided in the substrate between the first photoelectric conversion area and the second photoelectric conversion area; a first area included in the first pixel; a second area included in the second pixel; and a third area in contact with the first area, the second area, and the trench.

The electronic device according to an aspect of the present technology includes this image sensor.

Advantageous Effects of Invention

According to the aspect of the present technology, it is possible to increase an S/N ratio.

The effects described herein are not necessarily limited and may be any effects described in the present disclosure.

3

Figure 9:
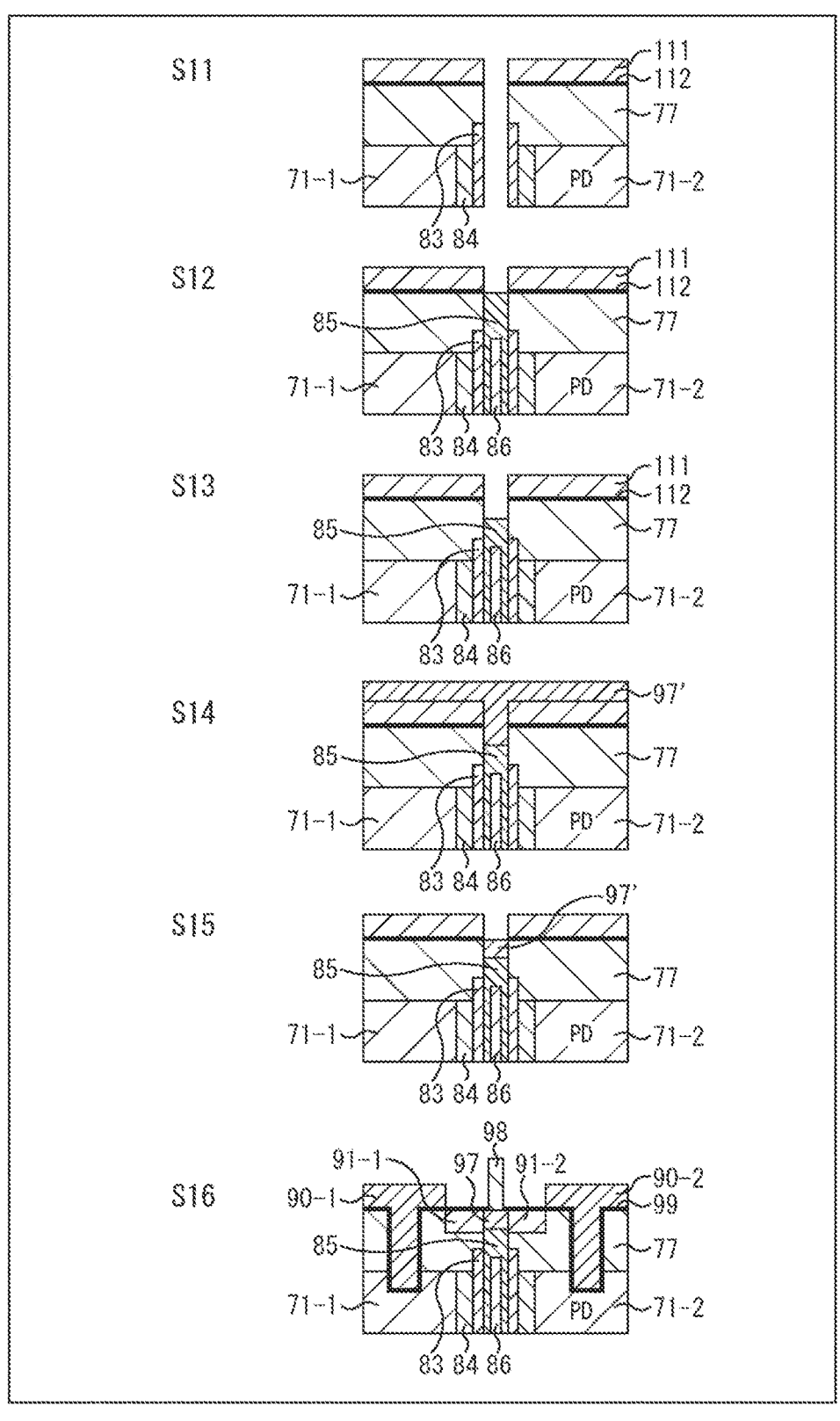

FIG. 9 is a diagram illustrating fabrication of the image sensor.

Figure 10:
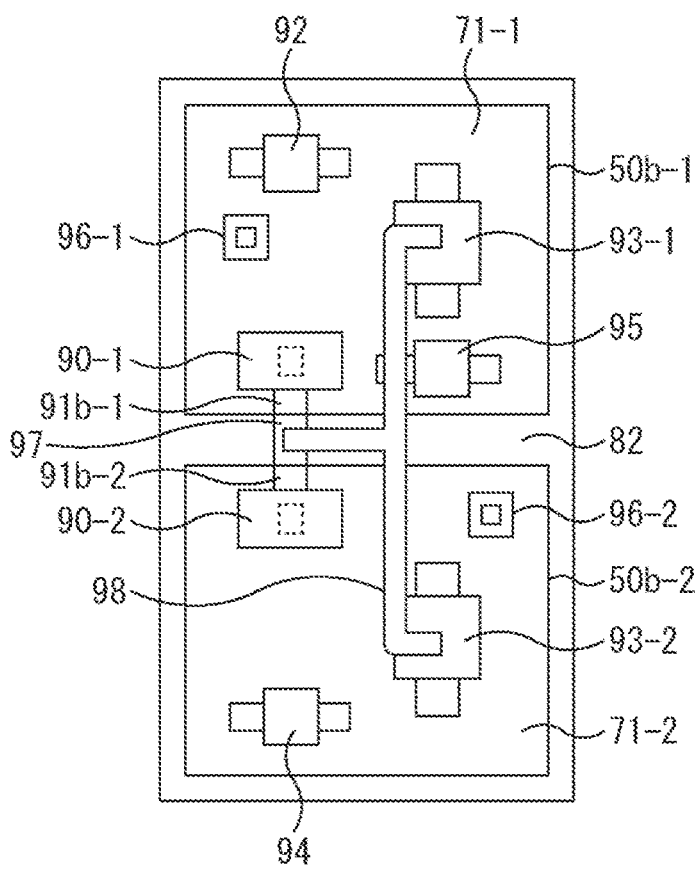

FIG. 10 is a plan view of an image sensor according to a second embodiment.

Figure 11:
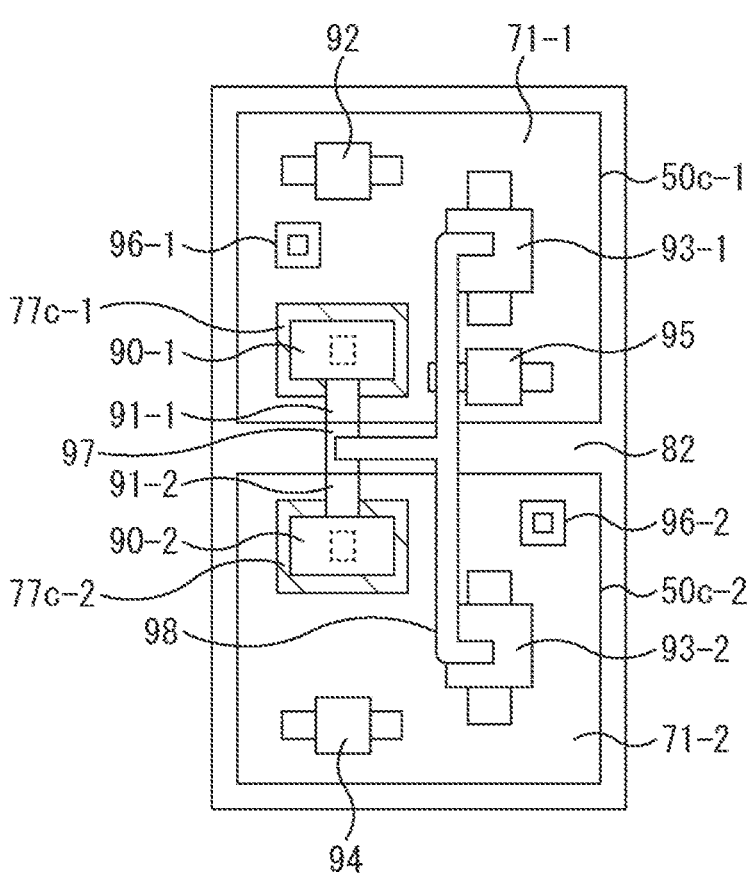

FIG. 11 is a plan view of an image sensor according to a third embodiment.

Figure 12:
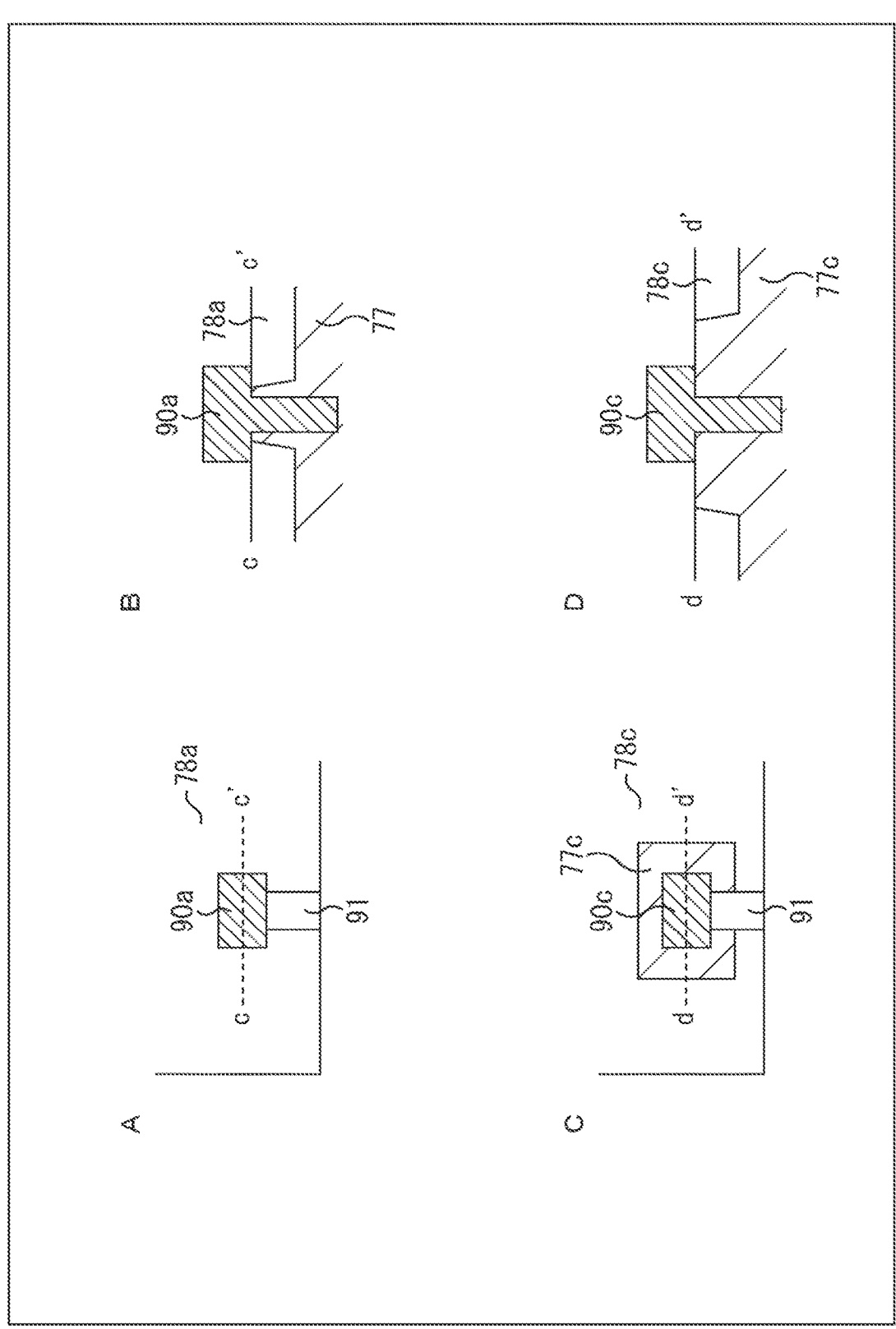

FIG. 12 is a cross-sectional view of the image sensor according to the third embodiment.

Figure 13:
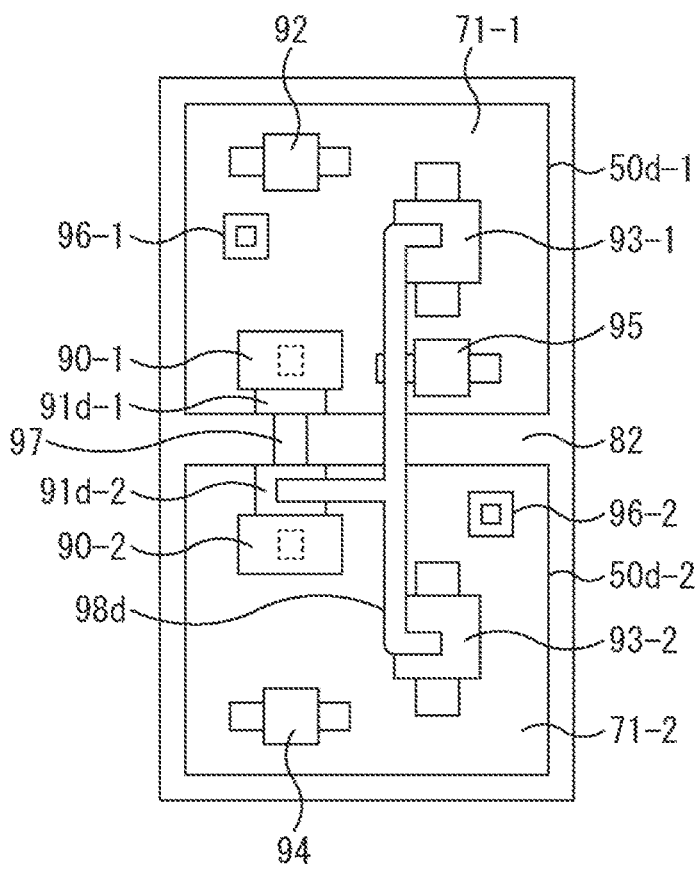

FIG. 13 is a plan view of an image sensor according to a fourth embodiment.

Figure 14:
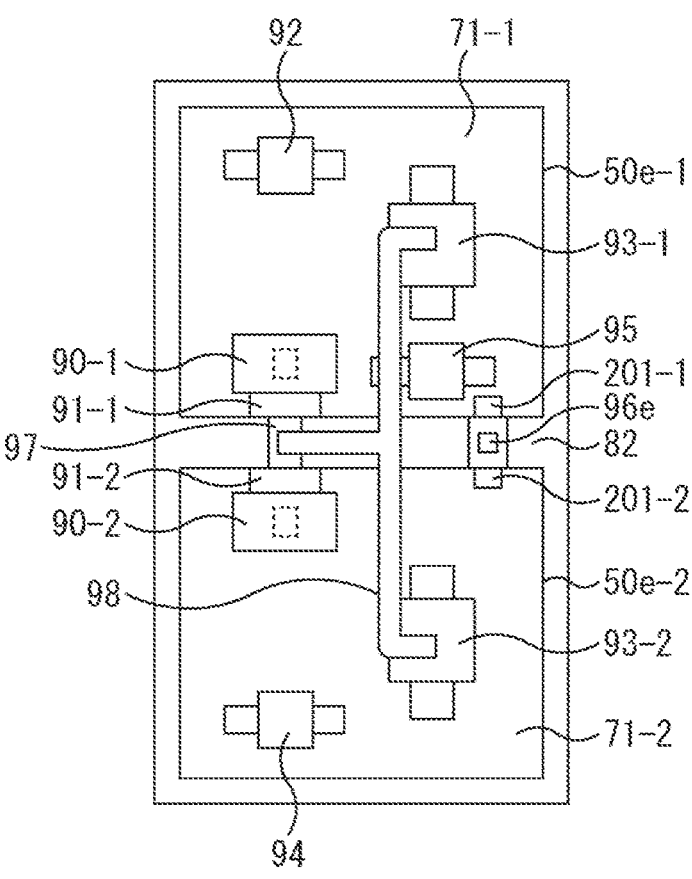

FIG. 14 is a plan view of an image sensor according to a fifth embodiment.

Figure 15:
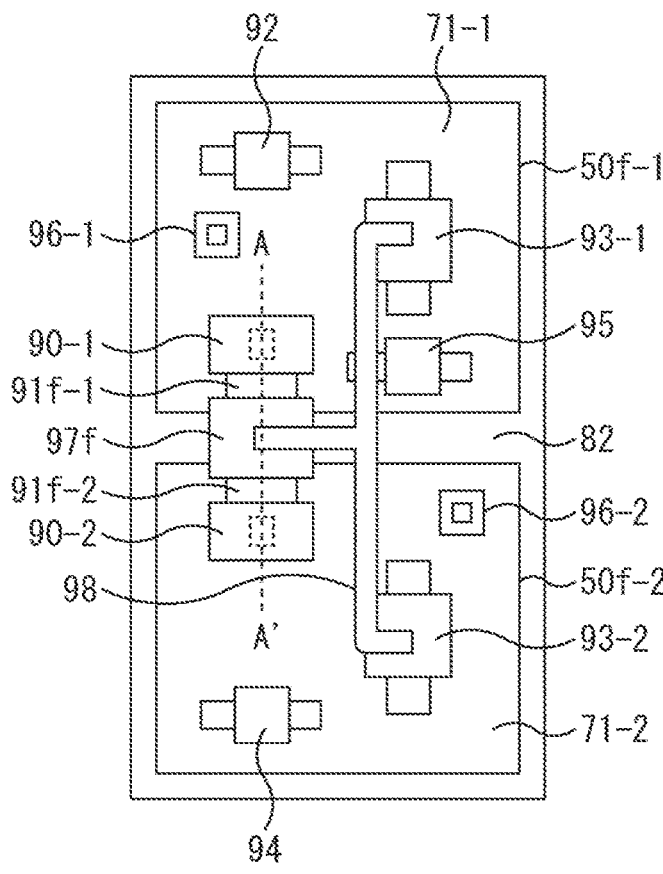

FIG. 15 is a plan view of an image sensor according to a sixth embodiment.

Figure 16:
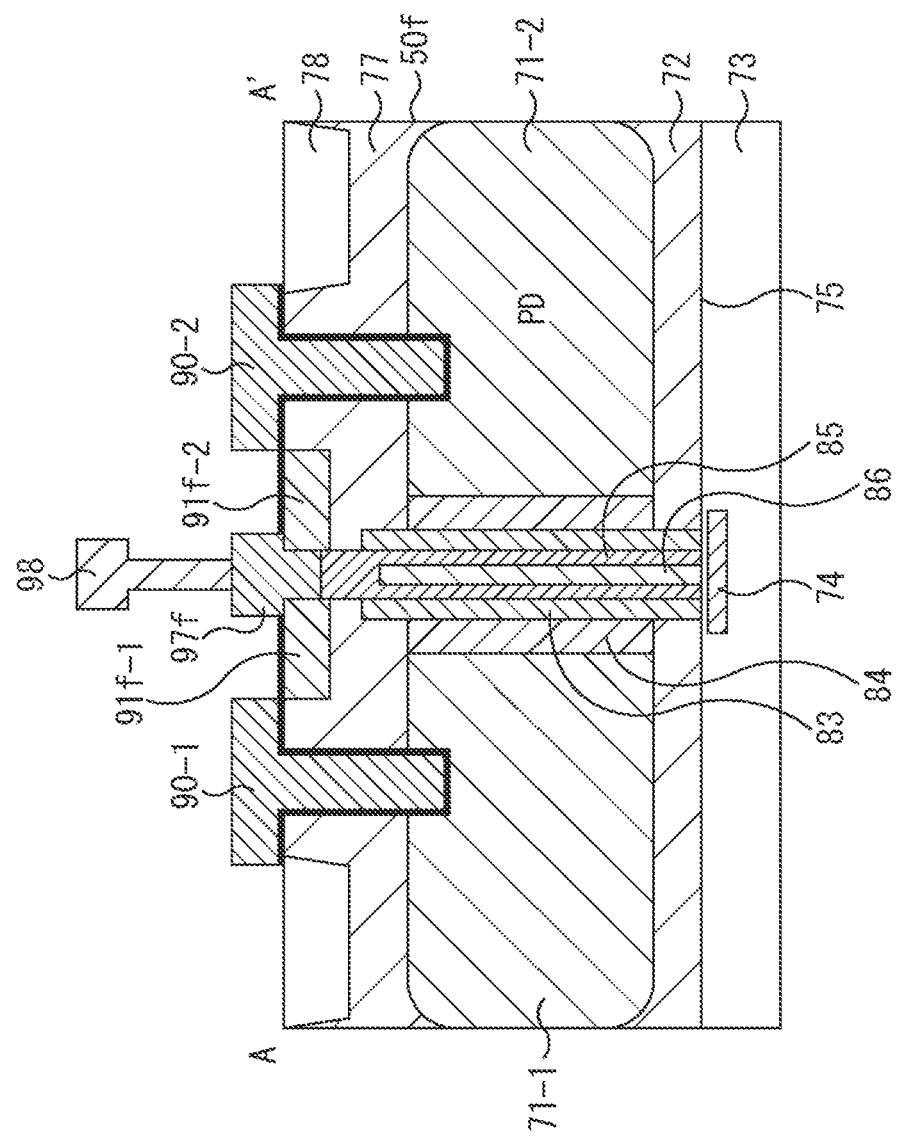

FIG. 16 is a cross-sectional view of the image sensor according to the sixth embodiment.

Figure 17:
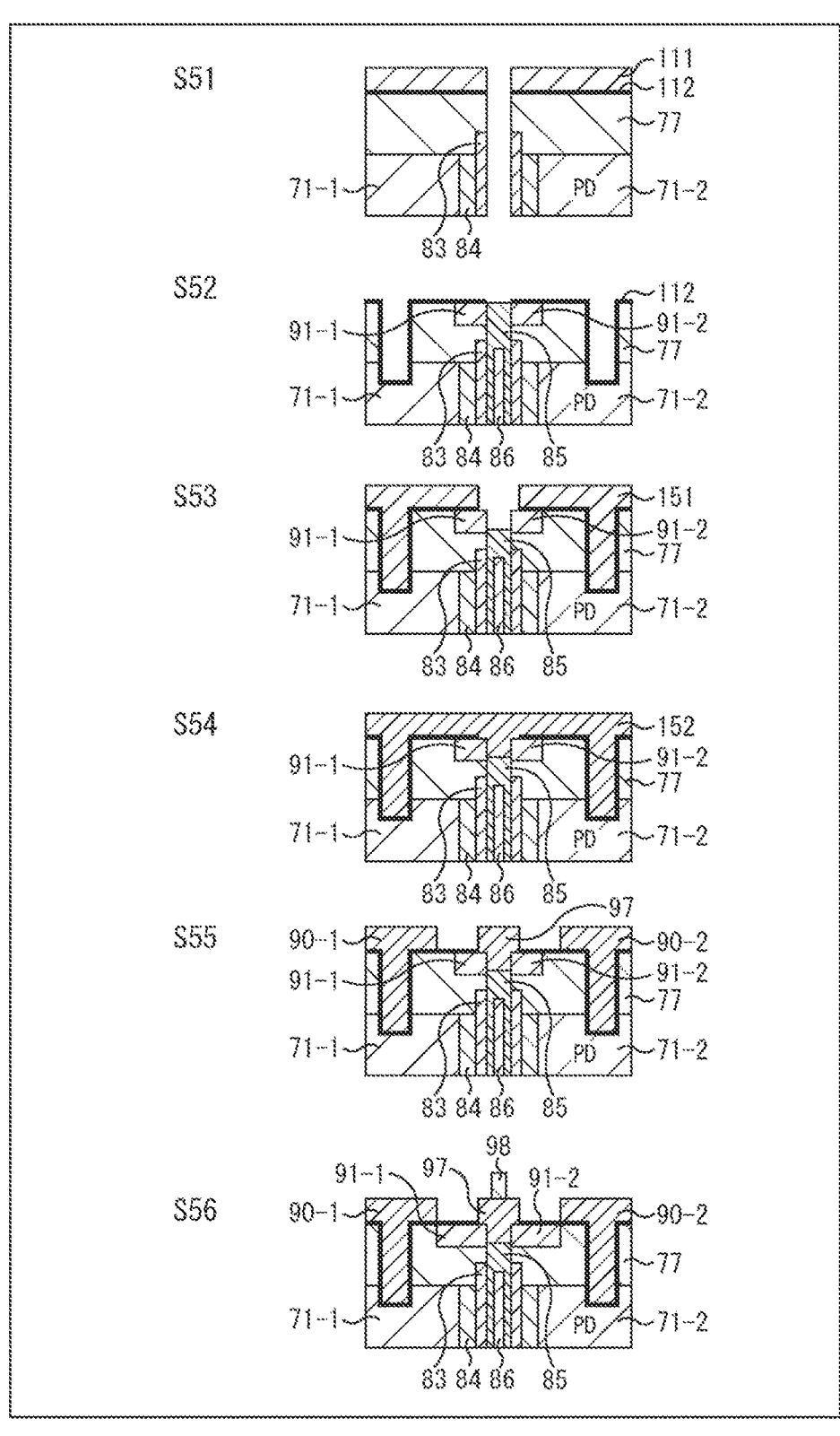

FIG. 17 is a diagram illustrating fabrication of the image sensor.

Figure 18:
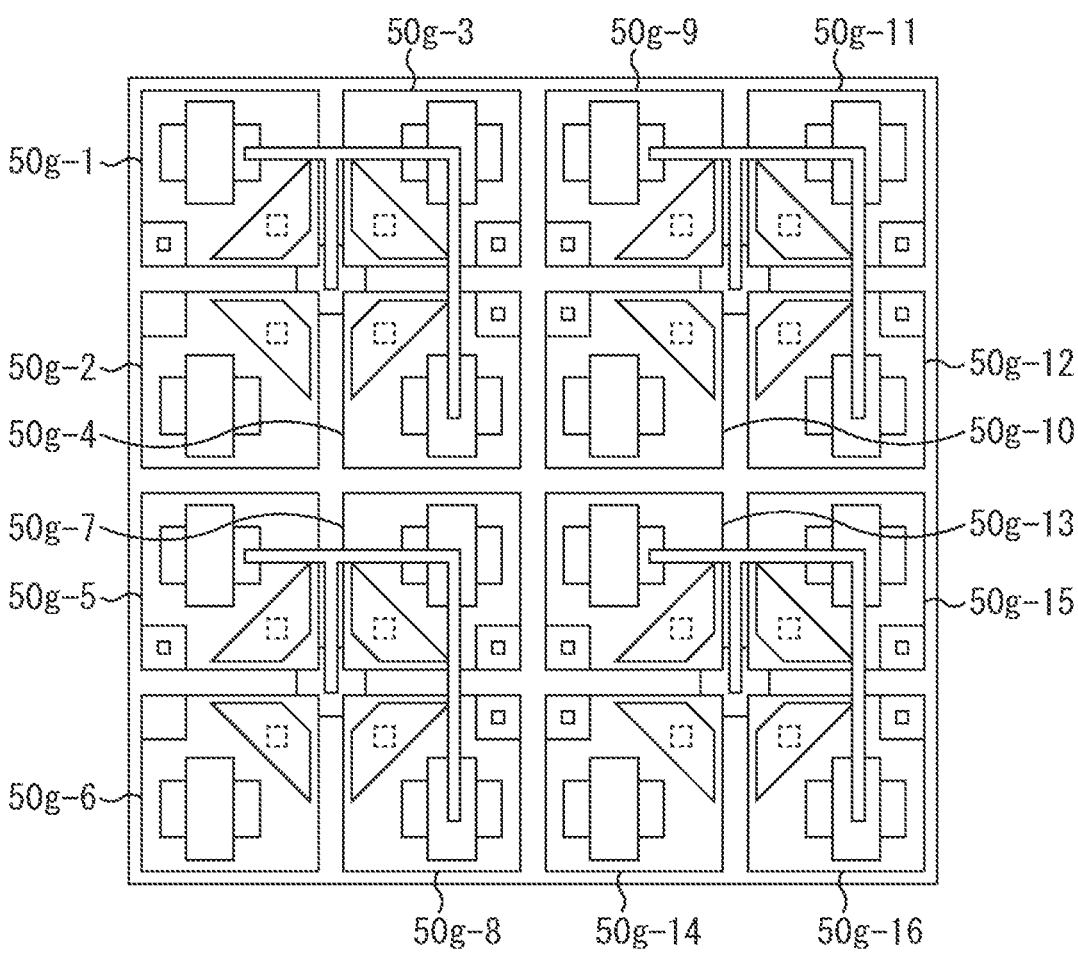

FIG. 18 is a plan view of an image sensor according to a seventh embodiment.

Figure 19:
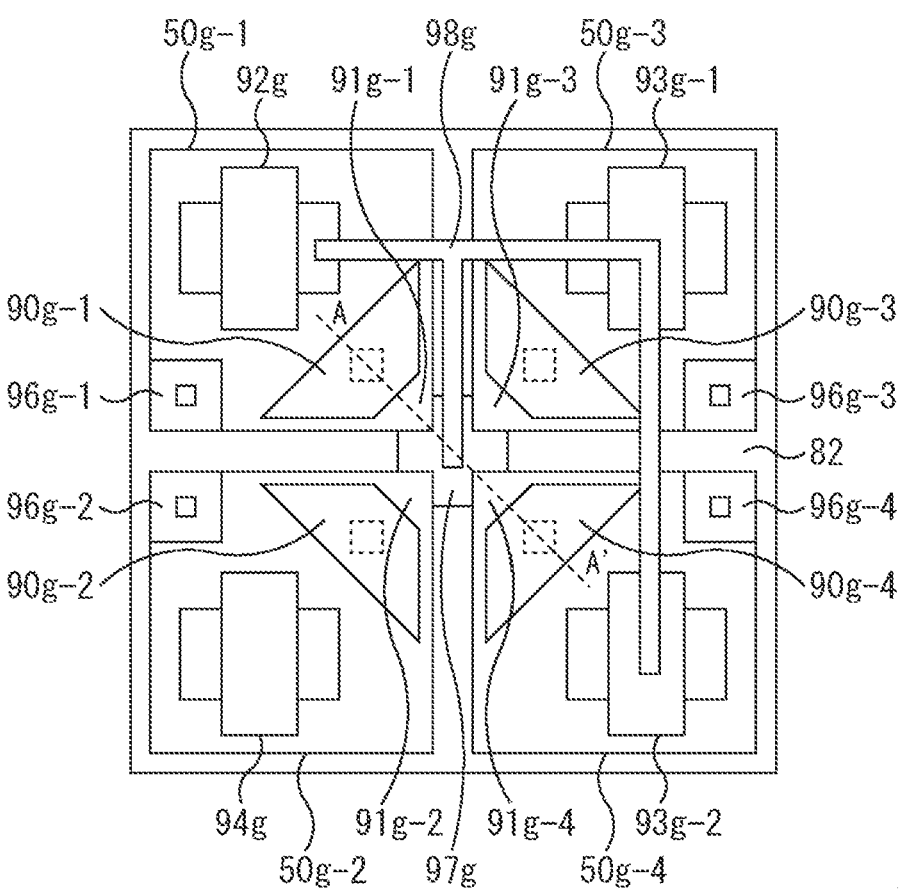

FIG. 19 is a plan view of the image sensor according to the seventh embodiment.

Figure 20:
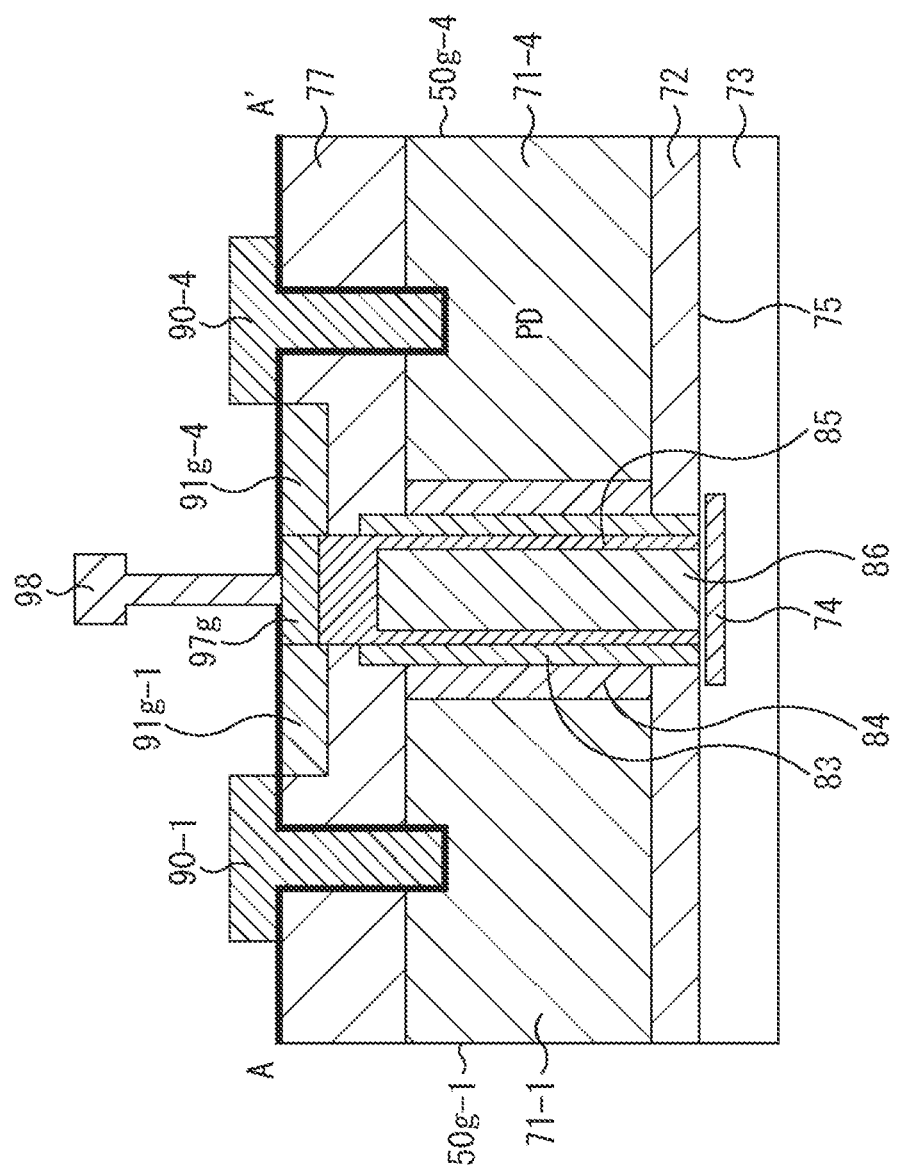

FIG. 20 is a cross-sectional view of the image sensor according to the seventh embodiment.

Figure 21:
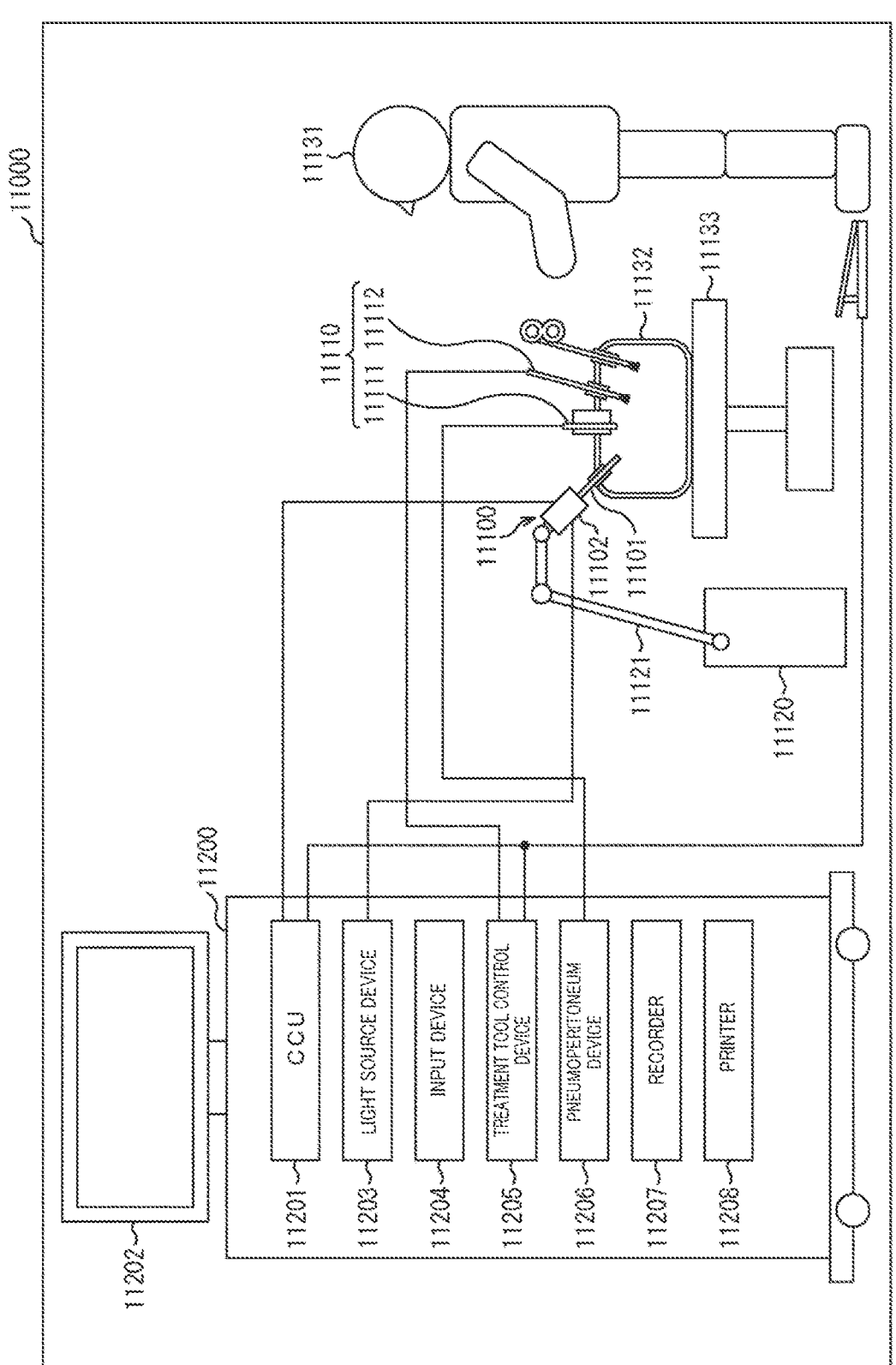

FIG. 21 is a diagram illustrating an example of a schematic configuration of an endoscopic surgery system.

Figure 22:
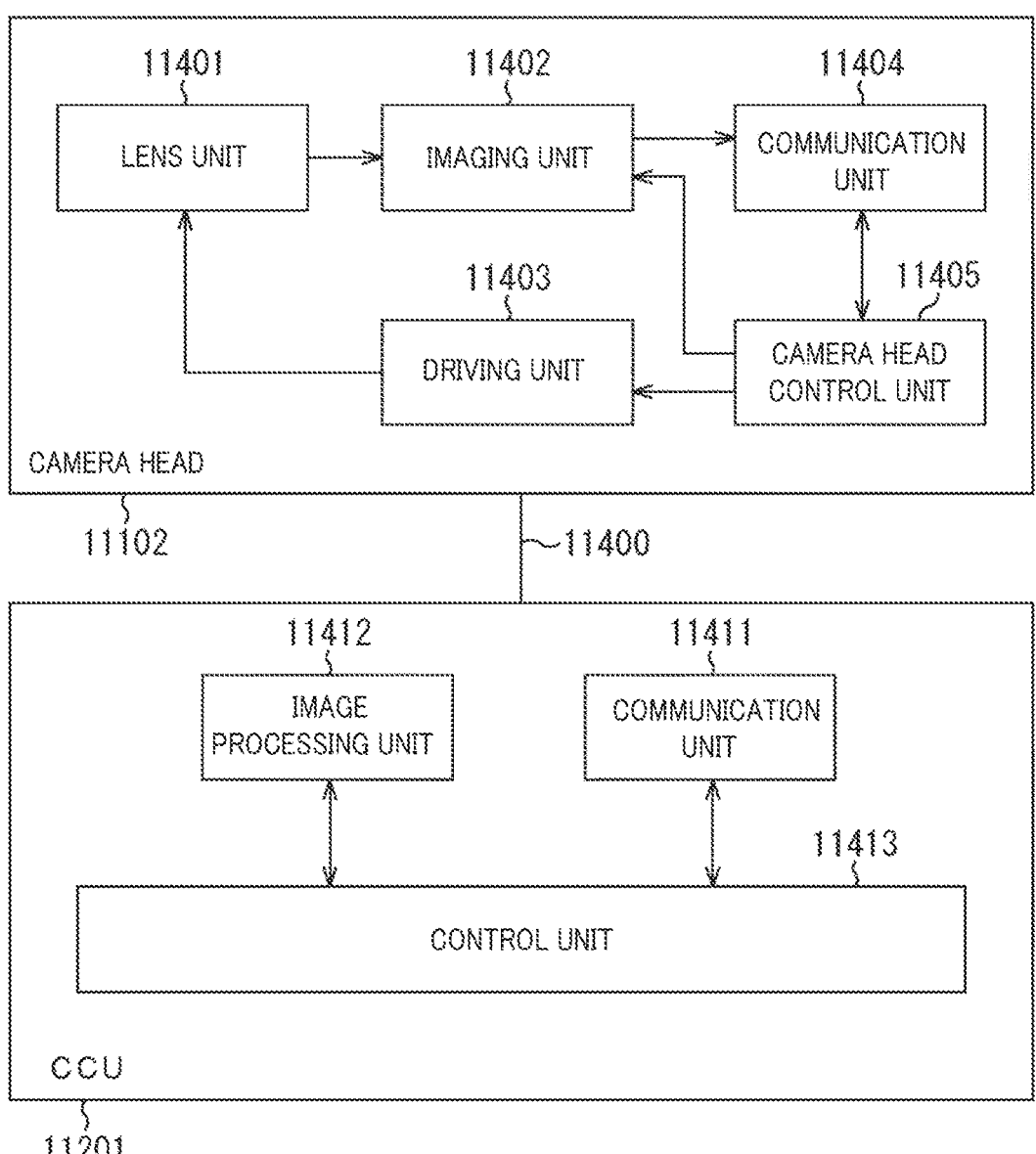

FIG. 22 is a block diagram illustrating an example of a functional configuration of a camera head and a CCU.

Figure 23:
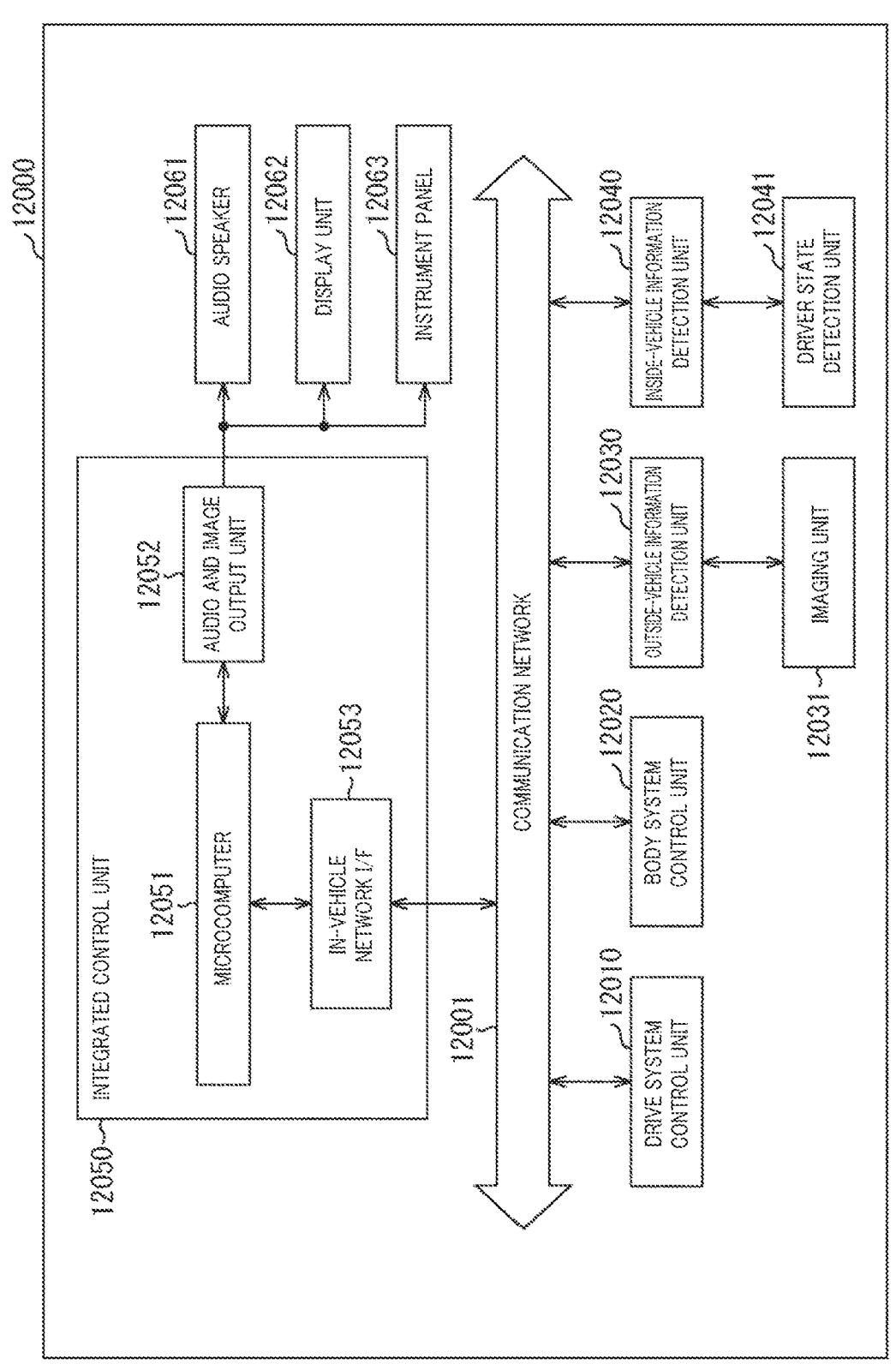

FIG. 23 is a block diagram illustrating an example of a schematic configuration of a vehicle control system.

Figure 24:
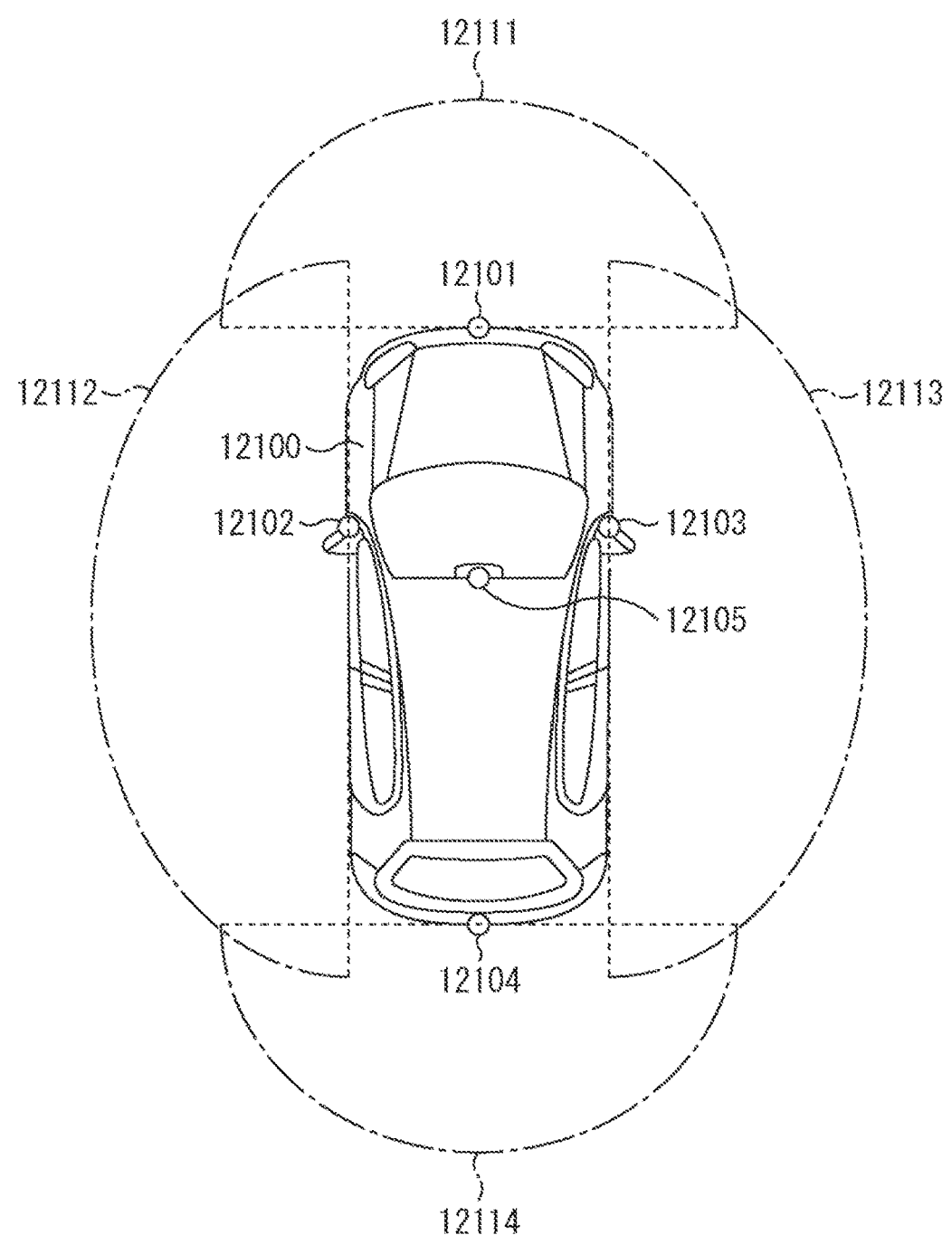

FIG. 24 is an illustrative diagram illustrating an example of installation positions of an outside-vehicle information detection unit and an imaging unit.

DESCRIPTION OF EMBODIMENTS

Hereinafter, forms (hereinafter, embodiments) for carrying out the present technology will be described.

A case in which the present technology is applied to an imaging apparatus will be described by way of example because the present technology can be applied to the imaging apparatus. Although description will be continued herein in a case of an imaging apparatus as an example, the present technology is not limited to application to an imaging apparatus, and can be applied to all electronic devices in which an imaging apparatus is used for an image capture unit (a photoelectric conversion unit), such as an imaging apparatus such as a digital still camera or a video camera, a mobile terminal device having an imaging function such as a mobile phone, and a copier in which an imaging apparatus is used for an image reading unit. A form of a module type mounted in an electronic device, that is, a camera module may be used as an imaging apparatus.

Figure 1:
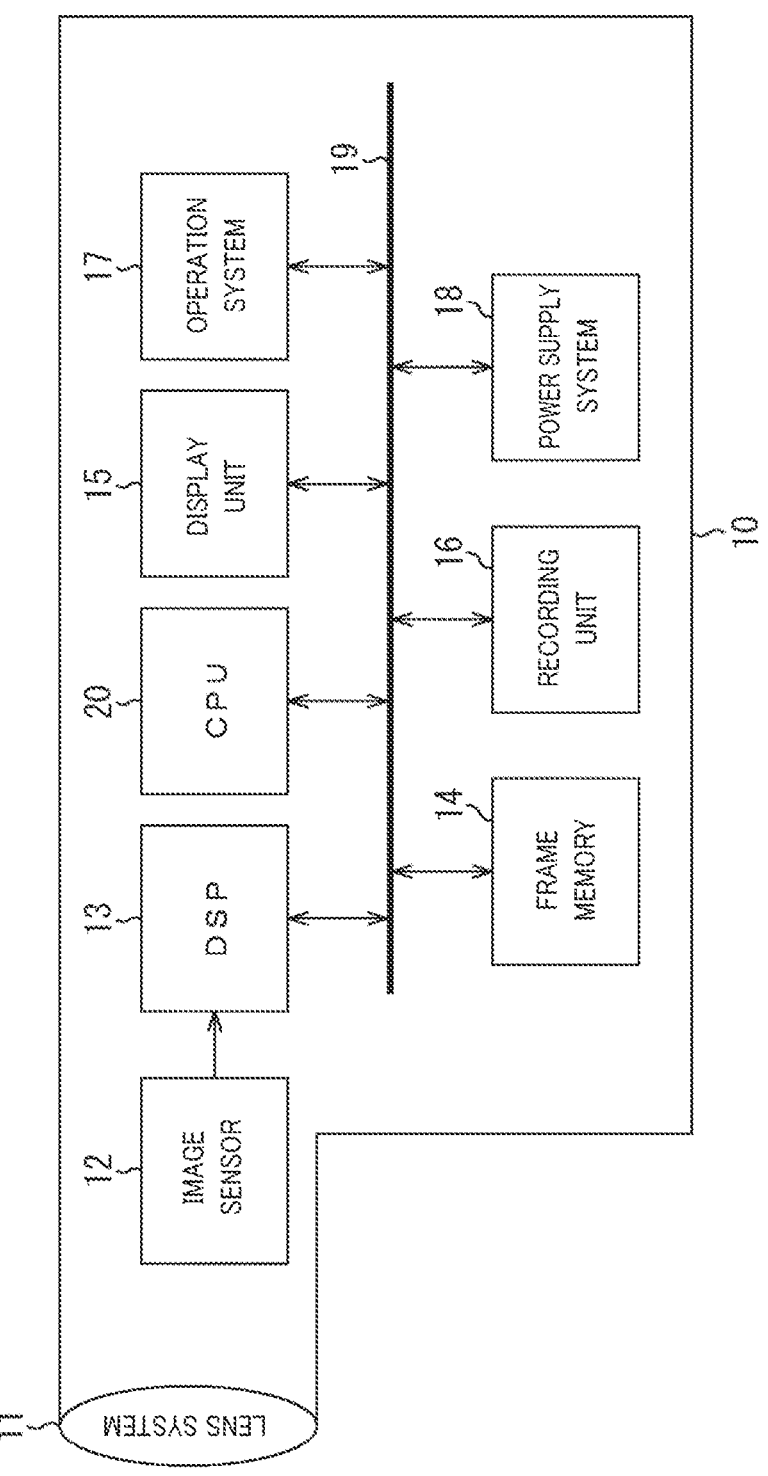
FIG. 1 is a diagram illustrating an example of a configuration of an imaging apparatus.

FIG. 1 is a block diagram illustrating an example of a configuration of an imaging apparatus which is an example of an electronic device of the present disclosure. The imaging apparatus 10 includes, for example, an optical system including a lens group 11 and the like, an image sensor 12, a DSP circuit 13 which is a camera signal processing unit, a frame memory 14, a display unit 15, a recording unit 16, an operation system 17, and a power supply system 18, as illustrated in FIG. 1.

The DSP circuit 13, the frame memory 14, the display unit 15, the recording unit 16, the operation system 17, and the power supply system 18 are connected to each other via a bus line 19. The CPU 20 controls each of the units in the imaging apparatus 10.

The lens group 11 captures incident light (image light) from a subject and forms an image on an imaging surface of the image sensor 12. The image sensor 12 converts a light amount of the incident light formed as an image on the imaging surface by the lens group 11 into an electrical signal in units of pixels and outputs the electrical signal as a pixel signal. As the image sensor 12, an image sensor (an image sensor) including pixels to be described below can be used.

The display unit 15 includes a panel-type display unit such as a liquid crystal display unit or an organic electro luminescence (EL) display unit, and displays a moving image or a still image captured by the image sensor 12. The recording unit 16 records the moving image or the still image captured by the image sensor 12 in a recording medium such as a hard disk drive (HDD) or a memory card.

The operation system 17 generates operation commands for various functions of the present imaging apparatus under an operation of a user. The power supply system 18 appropriately supplies various voltages serving as operating voltages of the DSP circuit 13, the frame memory 14, the display unit 15, the recording unit 16, and the operation system 17 to such supply targets.

Configuration of Image Sensor

Figure 2:
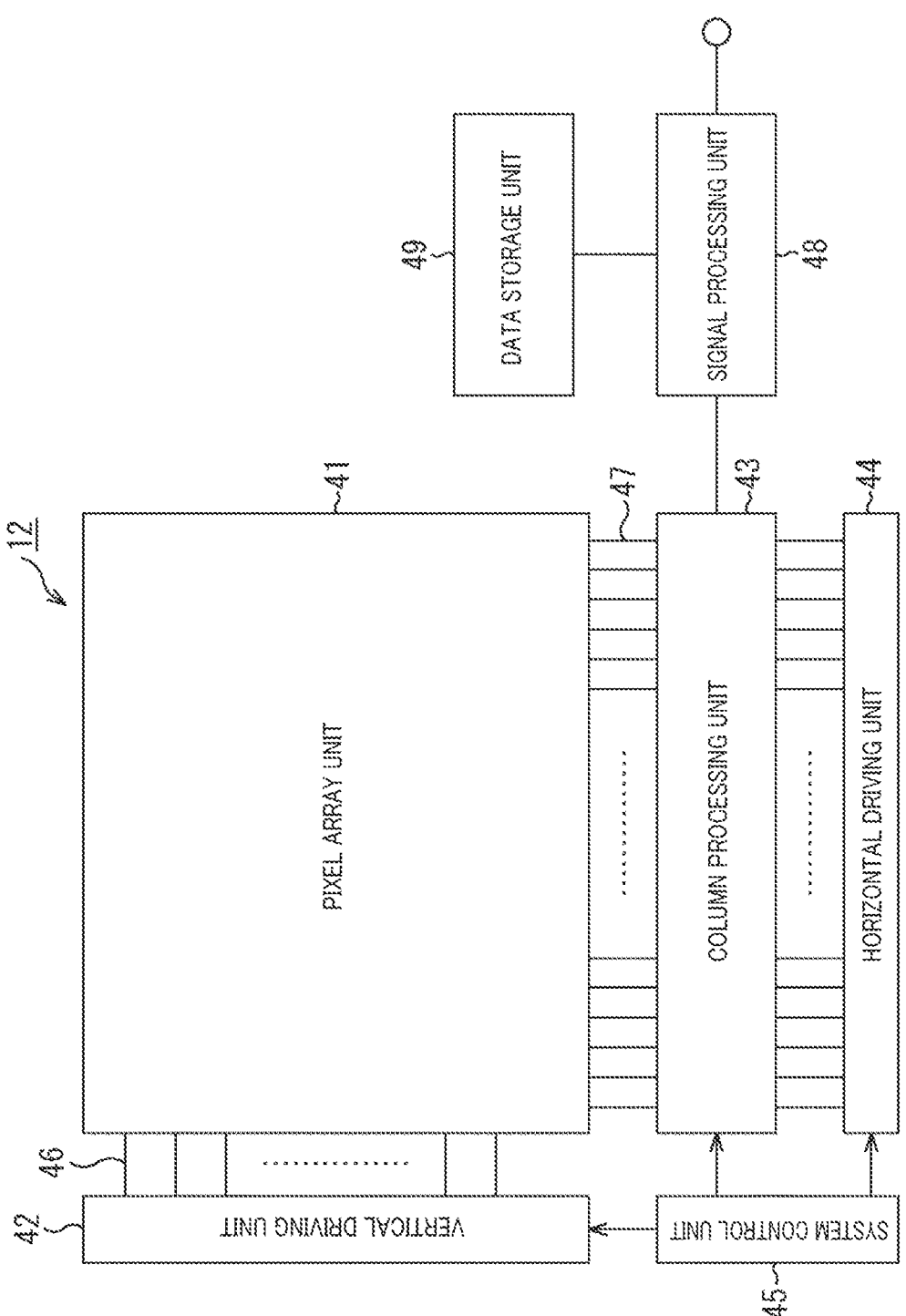
FIG. 2 is a diagram illustrating an example of a configuration of an image sensor.

FIG. 2 is a block diagram illustrating an example of a configuration of the image sensor 12. The image sensor 12 can be a complementary metal oxide semiconductor (CMOS) image sensor.

The image sensor 12 includes a pixel array unit 41, a vertical driving unit 42, a column processing unit 43, a horizontal driving unit 44, and a system control unit 45. The pixel array unit 41, the vertical driving unit 42, the column processing unit 43, the horizontal driving unit 44, and the system control unit 45 are formed on a semiconductor substrate (chip) that is not illustrated.

In the pixel array unit 41, unit pixels (for example, pixels 50 in FIG. 3) each having a photoelectric conversion element that generates a photocharge of a charge amount according to an amount of incident light and accumulates the photocharge therein are arranged two-dimensionally in a matrix. Hereinafter, the photocharge of a charge amount according to the amount of incident light may be simply referred to as a "charge" and the unit pixel may be simply referred to as a "pixel".

In the pixel array unit 41, a pixel drive line 46 is formed in each row in a horizontal direction in FIG. 2 (an arrangement direction of the pixels in the pixel row) in a pixel arrangement in a matrix and a vertical signal line 47 is formed in each column in a vertical direction in FIG. 2 (an arrangement direction of pixels in a pixel column). One end of the pixel drive line 46 is connected to an output terminal of the vertical driving unit 42 corresponding to each row.

The image sensor 12 further includes a signal processing unit 48 and a data storage unit 49. The signal processing unit 48 and the data storage unit 49 may be a process using an external signal processing unit provided in a substrate different from the image sensor 12, such as a digital signal processor (DSP), or software, or may be mounted on the same substrate as the image sensor 12.

The vertical driving unit 42 is a pixel driving unit that includes a shift register, an address decoder, and the like and drives all the respective pixels of the pixel array unit 41 simultaneously or in units of rows. Although a specific configuration of the vertical driving unit 42 is not specifically illustrated in the drawings, the vertical driving unit 42 includes a readout scanning system, and a sweep scanning system, or is configured to have batch sweep and batch transfer.

The readout scanning system sequentially selectively scans the unit pixels of the pixel array unit 41 in units of rows in order to read out signals from the unit pixels. In the case of row driving (a rolling shutter operation), for sweep, sweep scanning is performed at a time prior to readout scanning according to a shutter speed on a readout row on which the readout scanning is performed by the readout scanning system. In the case of global exposure (a global shutter operation), batch sweeping is performed at a time prior to batch transfer according to the shutter speed.

Unnecessary charge is swept (reset) from the photoelectric conversion elements of the unit pixels on the readout row by this sweep. A so-called electronic shutter operation is performed by sweeping (resetting) the unnecessary charge. Here, the electronic shutter operation is an operation of discarding photocharge of the photoelectric conversion element and newly starting exposure (starting accumulation of photocharge).

A signal read out by a readout; operation of the readout scanning system corresponds to an amount of light that has been incident after an immediately previous readout operation or electronic shutter operation. In the case of the row driving, a period from a readout timing in the immediately previous readout operation or a sweep timing in the electronic shutter operation to a readout timing in a current readout operation is a photocharge accumulation period (an exposure period) in the unit pixel. In the case of the global exposure, a period from batch sweep to batch transfer is an accumulation period (an exposure period).

A pixel signal output from each unit pixel of the pixel row selectively scanned by the vertical driving unit 42 is supplied to the column processing unit 43 through each vertical signal line 47. The column processing unit 43 performs predetermined signal processing on the pixel signal output from each unit pixel of the selected row through the vertical signal line 47 for each pixel column of the pixel array unit 41, and temporarily holds the pixel signal after the signal processing.

Specifically, the column processing unit 43 performs at least a noise removal process such as a correlated double sampling (CDS) process as signal processing. Fixed pattern noise specific to a pixel, such as reset noise or a variation in a threshold value of an amplification transistor, is removed by the correlated double sampling in the column processing unit 43. The column processing unit 43 can have, for example, an analog-to-digital (AD) conversion function to output a signal level as a digital signal, in addition to the noise removal process.

The horizontal driving unit 44 includes a shift register, an address decoder, and the like, and sequentially selects unit circuits corresponding to the pixel columns of the column processing unit 43. The pixel signals subjected to the signal processing by the column processing unit 43 are sequentially output to the signal processing unit 48 by the selective scanning of the horizontal driving unit 44.

The system control unit 45 includes, for example, a timing generator that generates various timing signals, and performs control of driving of the vertical driving unit 42, the column processing unit 43, the horizontal driving unit 44, and the like on the basis of the various timing signals generated by the timing generator.

The signal processing unit 48 has at least an addition processing function and performs various signal processing such as addition processing on the pixel signals output from the column processing unit 43. The data storage unit 49 temporarily stores data required for the signal processing in the signal processing unit 48.

Pixel Arrangement in Pixel Array Unit

Example of Configuration of Pixels in First Embodiment

Figure 3:
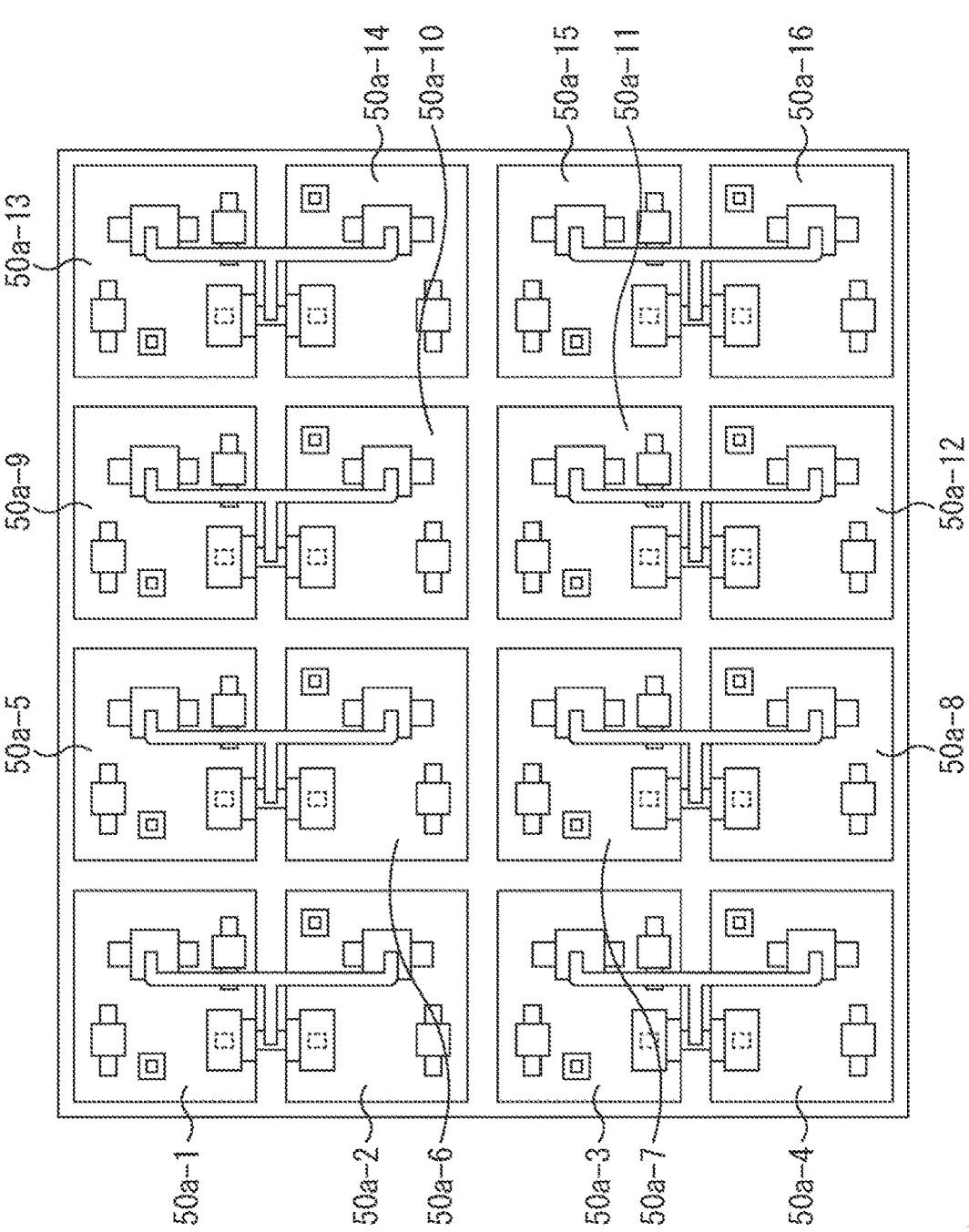
FIG. 3 is a plan view of a first embodiment of an image sensor to which the present technology is applied.

FIG. 3 is a diagram illustrating an arrangement example of the unit pixels 50 arranged in the matrix in the pixel array unit 41. Description will be continued in a case in which the pixel 50 in the first embodiment is a pixel 50a.

In the pixel array unit 41, a plurality of unit pixels 50a are arranged in a matrix. In FIG. 3, 16 (4×4) pixels 50a disposed in the pixel array unit 41 are illustrated. A case in which two pixels are shared will be described herein as an example. As will be described below with reference to FIG. 4, in the two pixels, a reset transistor, an amplification transistor, and a selection transistor are shared, and a floating diffusion (FD) is shared.

In FIG. 3, the two pixels 50a arranged in a vertical direction are shared pixels. Pixels 50a-1 and 50a-2 arranged in the vertical direction are shared pixels. Similarly, pixels 50a-3 and 50a-4, pixels 50a-5 and 50a-6, pixels 50a-7 and 50a-8, pixels 50a-9 and 50a-10, pixels 50a-11 and 50a-12, pixels 50a-13 and 50a-14, and pixels 50a-15 and 50a-16, which are arranged in the vertical direction, are shared pixels.

When it is not necessary for the pixels 50a-1 to 50a-16 to be individually distinguished, the pixels are simply described as the pixel 50a. Other parts are described similarly.

Figure 4:
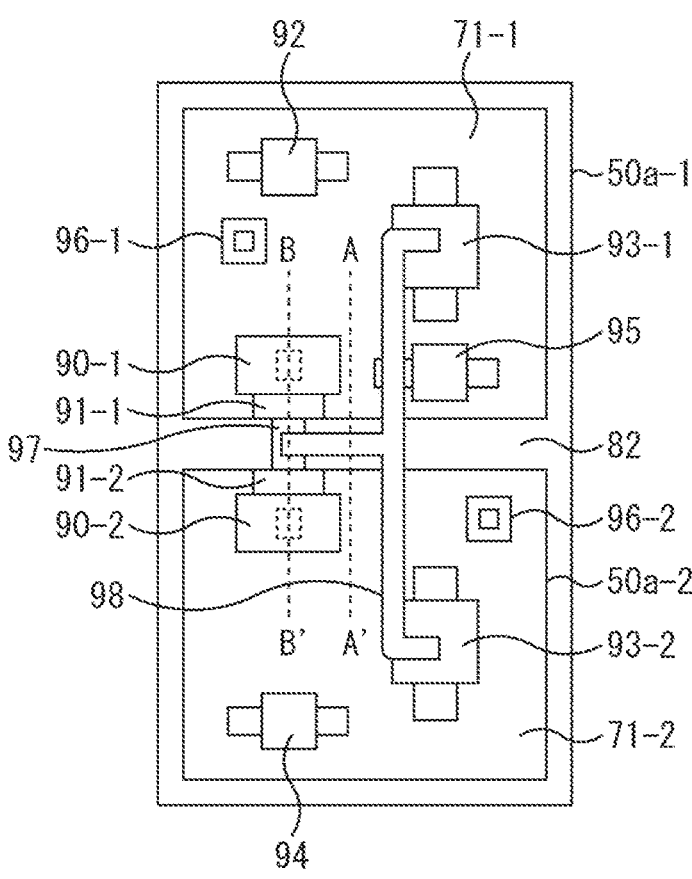
FIG. 4 is a plan view of the first embodiment of the image sensor to which the present technology is applied.
Figure 5:
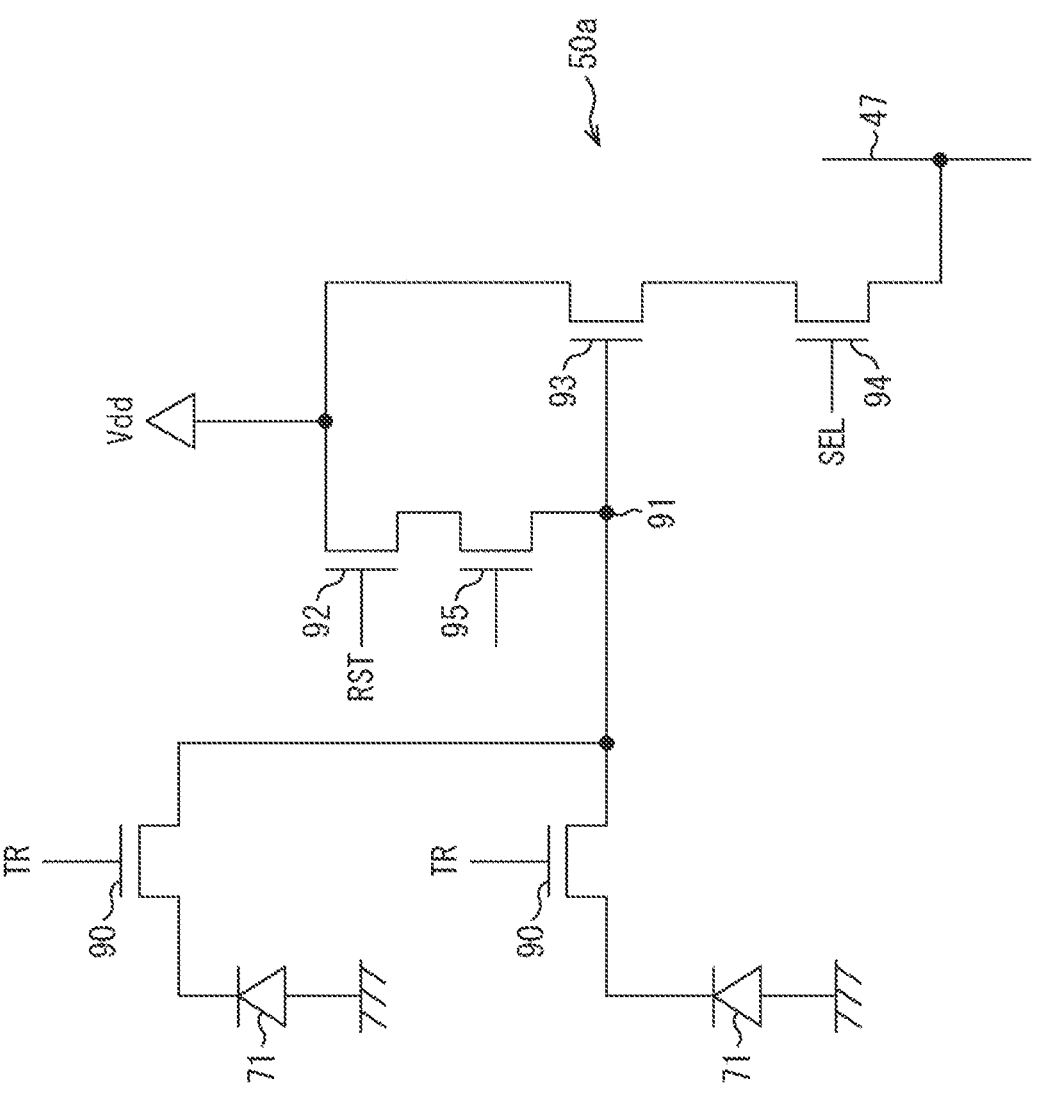
FIG. 5 is a circuit diagram of the image sensor.

FIG. 4 is a plan view of the two shared pixels, and FIG. 5 is a circuit diagram when the two pixels are shared. Although a case in which the pixel 50 to be described below is of a back-surface irradiation type will be described by way of example, the present technology can also be applied to a surface irradiation type. Further, the fallowing description is an example and can be appropriately changed according to products. Although description will continue, for example, for a case in which one selection transistor is shared by two shared pixels, this can be appropriately changed and, for example, two selection transistors may be included in a large format type or the like, and the present technology can be applied to a configuration after such a change.

Description will continue using FIG. 4, in which the pixel 50a-1 and the pixel 50a-2 arranged in the vertical direction are illustrated. In FIG. 4, one square represents one pixel 50a. The pixel 50a includes a photodiode (PD) 71, and a through deep trench isolation (DTI) 82 is disposed to surround the PD 71. The through DTI 82 is formed in a shape that penetrates a Si substrate 70 (FIG. 6) in a depth direction between the through DTI 82 and the adjacent pixel 50a.

A transfer transistor 90-1, a floating diffusion (FD) 91-1, a reset transistor 92, an amplification transistor 93-1, a conversion efficiency switching transistor 95, and a ground (GND) contact 96-1 are formed on a front surface side of the pixel 50a-1. A transfer transistor 90-2, an FD 91-2, a selection transistor 94, and a GND contact 96-2 are formed on a front surface side of the pixel 50a-2.

The reset transistor 92, the amplification transistor 93, the selection transistor 94, and the conversion efficiency switching transistor 95 are configured to be shared by the pixel 50a-1 and the pixel 50b-1. The amplification transistor 93 includes the amplification transistor 93-1 disposed in the pixel 50*a*-1 and an amplification transistor 93-2 disposed in the pixel 50*a*-2.

Because sharing a plurality of transistors between the two pixels 50*a* reduces the number of transistors to be disposed in one pixel, it is possible to increase a size of an area in which one transistor is disposed. Effects such as noise reduction can be obtained by the transistors being configured to be large.

Further, when the amplification transistor 93 includes the amplification transistor 93-1 disposed in the pixel 50*a*-1 and the amplification transistor 93-2 disposed in the pixel 50*a*-2 as illustrated in FIG. 3, it is possible to assign a larger area to the amplification transistor 93 and to reduce noise.

The FD 91-1 of the pixel 50*a*-1 and the FD 91-2 of the pixel 50*a*-2 are configured to be connected by a connection portion 97 formed in a part of the through DTI 82 and to function as one FD 91.

An FD wiring 98 is connected to the amplification transistor 93-1, the amplification transistor 93-2, and the conversion efficiency switching transistor 95. Further, a part of the FD wiring 98 is formed on the through DTI 82.

Referring to FIG. 5, the PD 71 generates and accumulates charge (signal charge) according to an amount of received light. The PD 71 includes a grounded anode terminal, and a cathode terminal connected to the FD 91 via the transfer transistor 90.

When the transfer transistor 90 is turned on by a transfer signal TR, the transfer transistor 90 reads out the charge generated in the PD 71 and transfers the charge to the FD 91.

The FD 91 holds the charge read out from the PD 71. When the reset transistor 92 is turned on by a reset signal RST, the charge accumulated in the FD 91 is discharged to a drain (a constant voltage source Vdd) so that a potential of the FD 91 is reset. When the conversion efficiency switching transistor 95 is turned on, the FD 91 is electrically coupled, a floating diffusion area of the FD 91 is extended, a capacity of the FD 91 is increased, and the conversion efficiency is decreased.

The amplification transistor 93 outputs a pixel signal according to the potential of the FD 91. That is, the amplification transistor 93 constitutes a source follower circuit with a load MOS (not illustrated) serving as a constant current source connected via the vertical signal line 47, and a pixel signal indicating a level according to the charge accumulated in the FD 91 is output from the amplification transistor 93 to the column processing unit 43 (FIG. 2) via the selection transistor 94 and the vertical signal line 47.

The selection transistor 94 is turned on when the pixel 31 is selected by the selection signal SEL, and outputs a pixel signal of the pixel 31 to the column processing unit 43 via the vertical signal line 47. Each of signal lines through which the transfer signal TR, the selection signal SEL, and the reset signal RST are transferred corresponds to the pixel drive line 46 in FIG. 2.

The pixel 50*a* can be configured as described above, but the pixel 50*a* is not limited thereto and other configurations can be adopted.

Configuration of Cross Section of Pixel 50*a*

Figure 6:
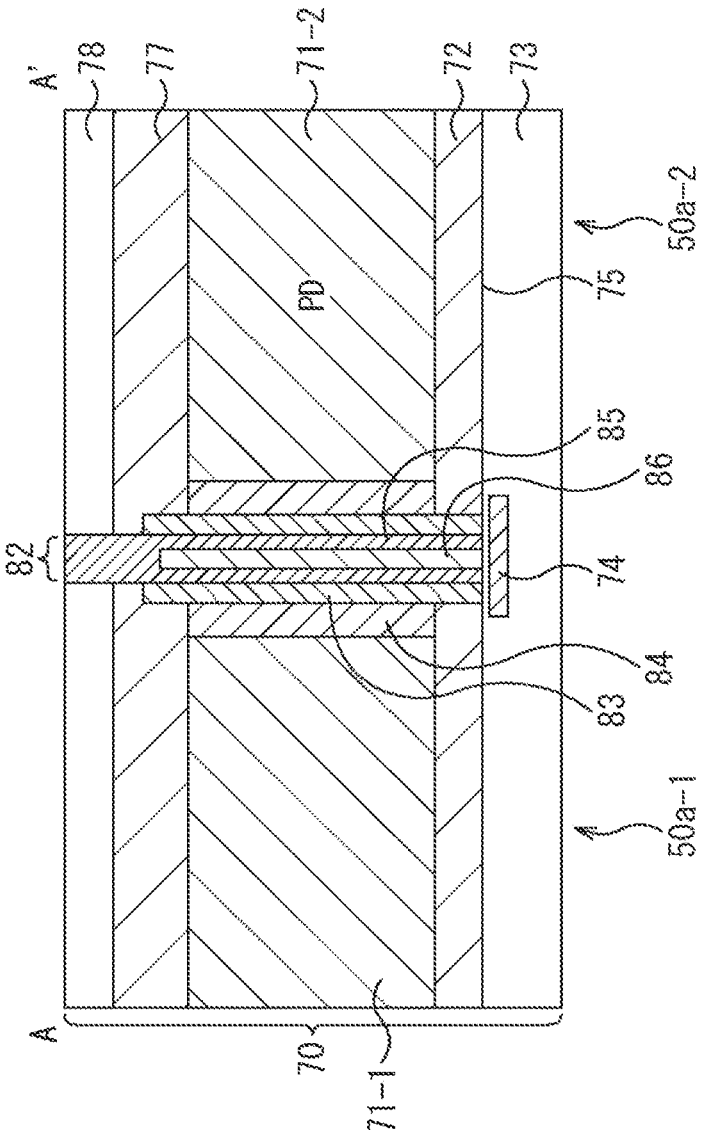
FIG. 6 is a cross-sectional view of the image sensor according to the first embodiment.

FIG. 6 is a cross-sectional view in a vertical direction of the pixel 50*a*, which corresponds to a position of a line segment A-A' in FIG. 4. The pixel 50*a* includes the PD 71 that is a photoelectric conversion element of each pixel formed inside the Si substrate 70. A P-type area 72 is formed on the light incidence side (the lower side and the back side in FIG. 6) of the PD 71, and a flattening film 73 is formed in a layer further below the P-type area 72. A boundary between the P-type area 72 and the flattening film 73 is a back surface Si interface 75.

A light shielding film 74 is formed in the flattening film 73. The light shielding film 74 is provided to prevent light from leaking into an adjacent pixel, and is formed between the adjacent PDs 71. The light shielding film 74 is made of, for example, a metal material such as tungsten (W).

An on-chip lens (OCL, not illustrated) that condenses the incident light on the PD 71 is formed on the flattening film 73 and the back surface side of the Si substrate 70. The OCL can be formed of an inorganic material and, for example, SiN, SiO, or SiOxNy (where $0<x\leq1$ and $0<y\leq1$) can be used.

Although not illustrated in FIG. 6, a transparent plate such as a cover glass or a resin may be bonded onto the OCL. Further, although not illustrated in FIG. 6, a color filter layer may be formed between the OCL and the flattening film 73. Further, the color filter layer may be configured such that a plurality of color filters are provided in each pixel and colors of the color filters are arranged according to a Bayer array, for example.

An active area (Pwell) 77 is formed on the side (the upper side; the front surface side in FIG. 6) opposite to the light incidence side of the PD 71. The active area 77 also includes an area in which an element isolation area (hereinafter referred to as a shallow trench isolation (STI) 78) for isolating pixel transistors or the like from each other is formed. A wiring layer (not illustrated) is formed on the front surface side (upper side of FIG. 6) of the Si substrate 70 and on the active area 77, and a plurality of transistors are formed in this wiring layer.

A trench is formed between the pixels 50*a*. This trench is referred to as a through DTI (Deep Trench. Isolation). The through DTI 82 is formed in a shape that penetrates the Si substrate 70 in a depth direction (a vertical direction in FIG. 6; a direction from a front surface to a back surface) between the adjacent pixels 50*a*. The through DTI 82 also functions as a light shielding wall between the pixels so that unnecessary light does not leak to the adjacent pixels 50*a*.

A P-type solid phase diffusion layer 83 and an N-type solid phase diffusion layer 84 are sequentially formed from the through DTI 82 to the PD 71 between the PD 71 and the through DTI 82. The P-type solid phase diffusion layer 83 is formed along the through DTI 82 until the P-type solid phase diffusion layer 83 comes into contact with the back surface Si interface 75 of the Si substrate 70. The N-type solid phase diffusion layer 84 is formed along the through DTI 82 until the N-type solid phase diffusion layer 84 comes into contact with the P-type area 72 of the Si substrate 70.

Although the solid phase diffusion layer refers to a P-type layer and an N-type layer formed using impurity doping in a fabrication method to be described below, the present technology is not limited to a fabrication method using solid phase diffusion and each of a P-type layer and an N-type layer produced using another fabrication method such as ion implantation may be provided between the through DTI 82 and the PD 71. Further, the PD 71 in the embodiment is configured as an N-type area. Photoelectric conversion is performed in a part or all of the N-type area.

Further, N-type means that the Si substrate 70 is doped with an impurity that behaves as an N-type. Here, because the Si substrate 70 is silicon (Si), an area in which silicon is doped with an N-type impurity becomes an N-type area. Similarly, P-type means that the Si substrate 70 is doped with an impurity that behaves as a P-type.

The P-type solid phase diffusion layer 83 is formed until the P-type solid phase diffusion layer 83 comes into contact with the back surface Si interface 75, whereas the N-type solid phase diffusion layer 84 does not come into contact with the back surface Si interface 75 and an interval is provided between the N-type solid phase diffusion layer 84 and the back surface Si interface 75.

With such a configuration, a PN junction area of the P-type solid phase diffusion layer 83 and the N-type solid phase diffusion layer 84 form a strong electric field area and hold the charge generated in the PD 71. With such a configuration, the P-type solid phase diffusion layer 83 and the N-type solid phase diffusion layer 84 formed along the through DTI 82 form a strong electric field area and hold the charge generated in the PD 71.

When the N-type solid phase diffusion layer 84 is formed along the through DTI 82 until the N-type solid phase diffusion layer 84 comes into contact with the back surface Si interface 75 of the Si substrate 70, charge generated in a portion in which the back surface Si interface 75 of the Si substrate 70 on the light incidence surface side and the N-type solid phase diffusion layer 84 are in contact with each other may flow into the PD 71, thereby causing deterioration of dark characteristics and, for example, a white spot is likely to be generated or a dark current is likely to be generated.

However, in the pixel 50a illustrated in FIG. 6, the N-type solid phase diffusion layer 84 is formed not to come into contact the back surface Si interface 75 of the Si substrate 70, and formed to come into contact with the P-type area 72 of the Si substrate 70 along the through DTI 82. With such a configuration, it is possible to prevent the charge from flowing into the PD 71 and the dark characteristics from deteriorating.

Further, in the pixel 50a illustrated in FIG. 6, a sidewall film 85 formed of SiO2 is formed on an inner wall of the through DTI 82, and a filling material 86 formed of polysilicon is embedded inside the sidewall film 85. In the sidewall film 85, the filling material 86 is formed to surround at least the side surfaces and the upper surface thereof.

The pixel 50a in the first embodiment is configured such that the P-type area 72 is provided on the back surface side, and the RD 71 and the N-type solid phase diffusion layer 84 do not exist near the back surface Si interface 75. This makes it possible to prevent the charge generated near the back surface Si interface 75 from flowing into the PD 71 and the dark characteristics from deteriorating.

For the through DTI 82, SiN may be adopted instead of SiO2 adopted for the sidewall film 85. Further, doped polysilicon may be used instead of the polysilicon used for the filling material 86. In a case in which an area is filled with the doped polysilicon or a case in which an area is filled with the polysilicon and then doped with N-type impurities or P-type impurities, and when a negative bias is applied thereto, it is possible to further improve dark characteristics on the sidewall of the through DTI 82.

Figure 7:
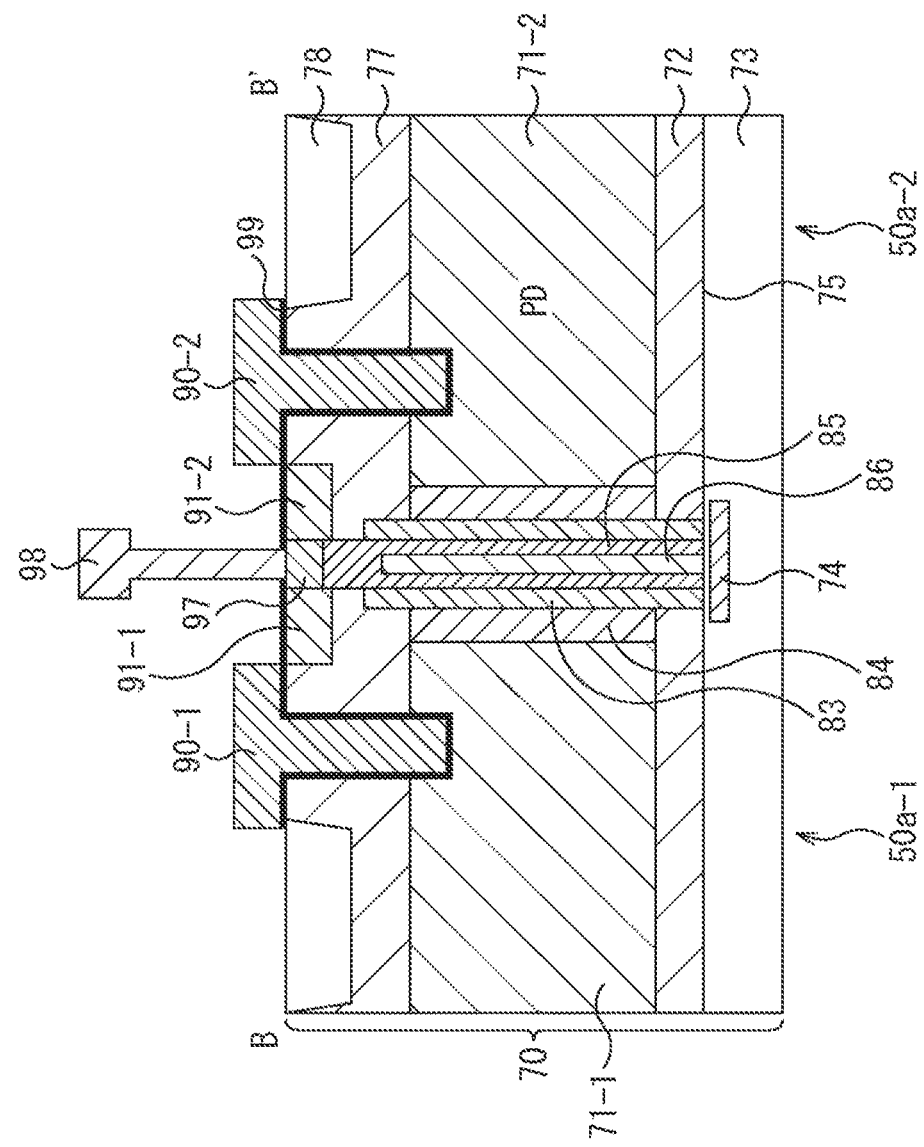
FIG. 7 is a cross-sectional view of the image sensor according to the first, embodiment.

FIG. 7 is a cross-sectional view in a vertical direction of the pixel 50a, which corresponds to a position of line segment B-B' in FIG. 4. Because a basic configuration is the same as the configuration illustrated in FIG. 6, description of the same portions will be omitted.

In a cross section in a vertical direction of the position pixel 50a of a line segment B-B' in FIG. 4, a point at which there is the transfer transistor 90 (a gate of the transfer transistor 90) and a point at which there is the FD 91 differ from those in a cross section in a vertical direction of the pixel 50a at a position of the line segment A-A' in FIG. 4.

A wiring layer (not illustrated) is formed on the front surface side (upper side of the drawing) of the Si substrate 70 and on the active area 77, and a plurality of transistors are formed in this wiring layer. FIG. 7 illustrates an example in which the transfer transistor 90 is formed.

A transfer transistor (gate) 90 is formed as a vertical transistor. That is, in the transfer transistor (gate) 90, a vertical transistor trench is open, and a transfer gate (TG) 90 for reading out the charge from the PD 71 is formed therein.

Although contacts connected to wirings in the wiring layer are formed in the transistors such as the transfer transistor 90, the contacts are not illustrated in FIG. 6. In the other cross-sectional views, the contacts are not illustrated in the description.

An SiO2 film 99 is formed in a portion in which the transfer transistor 90 (a transfer gate 90) and the active area 77 are in contact with each other. The FD 91 is formed in an area adjacent to the transfer transistor 90. In FIG. 7, the FD 91-1 is formed on the right side of the transfer transistor 90-1 of the pixel 50a-1 illustrated on the left side. Further, in FIG. 7, the FD 91-2 is formed on the left side of the transfer transistor 90-2 of the pixel 50a-2 illustrated on the right side.

The connection portion 97 is formed between the FD 91 and the FD 91-2. The connection portion 97 is formed on the through DTI 82 (inside the through DTI 82). The through DTI 82 is formed between the pixel 50a-1 and the pixel 50a-2, as described with reference to FIGS. 4 and 6. The sidewall film 85 in an upper portion of the through DTI 82 is partially removed, and the connection portion 97 is formed in a portion in which the sidewall film 85 in the upper portion of the through DTI 82 is partially removed.

When the connection portion 97 is formed as a rectangular parallelepiped, a bottom surface and two of four side surfaces are in contact with the sidewall film 85 (an SiO2 film). Further, two of the four side surfaces of the connection portion 97 are in contact with the FD 91. An upper surface of the connection portion 97 is in contact with a contact of the FD wiring 98.

The connection portion 97 is formed of, for example, polysilicon. Further, the connection portion 97 is the same semiconductor area as that of the FD 91. For example, when the FD 91 is an N-type semiconductor area, the connection portion 97 is also formed as an N-type semiconductor area. Alternatively, when the FD 91 is a P-type semiconductor area, the connection portion 97 is also formed as a P-type semiconductor area. Description will be continued herein, for example, in a case in which the FD 91 and the connection portion 97 are formed as the N-type semiconductor area.

The FD 91-1, the connection portion 97, and the FD 91-2 are formed to be a continuous N+ diffusion layer. In other words, the FD 91-1 and the connection portion 97 are in an electrically connected state, the FD 91-2 and the connection portion 97 are in a connected state, and as a result, the FD 91-1 and the FD 91-2 are in a connected state.

Thus, the FD 91-1, the connection portion 97, and the FD 91-2 exist as one diffusion layer and can be treated as one FD 91. Such an FD 91 is shared by the pixel 50a-1 and the pixel 50a-2.

The FD wiring 98 (a contact that is a part of the FD wiring 98) is connected to the connection portion 97. This FD wiring 98 is connected to a gate of the amplification transistor 93, as described with reference to FIG. 4. The charge read out from the PD 71 by the transfer transistor 90 flows to a wiring layer (not illustrated) via the FD 91 and the FD wiring 98 so that a gate potential of the amplification transistor 93 is changed.

US 12,689,841 B2

11                                                    12

Figure 8:
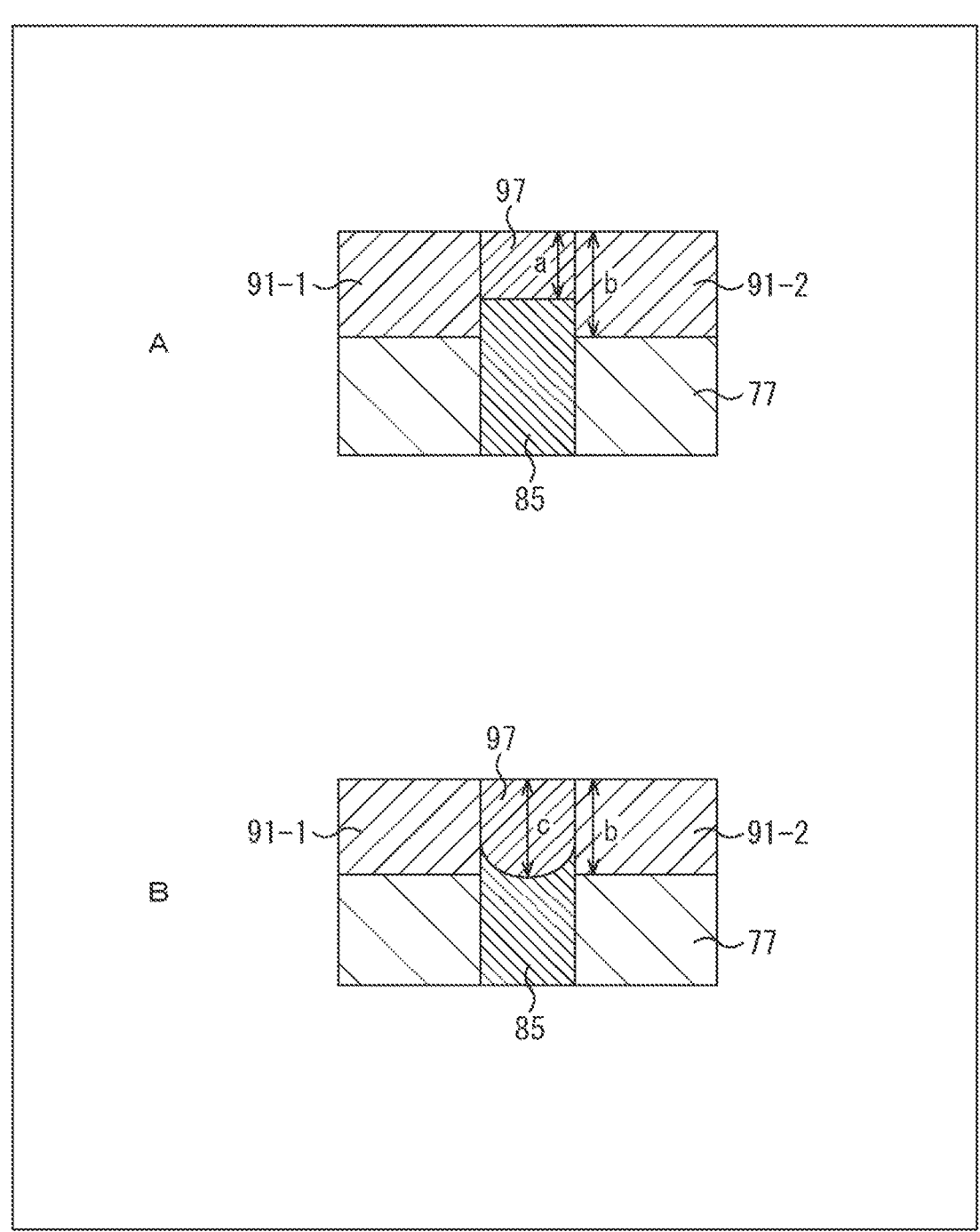
FIG. 8 is a diagram illustrating a configuration of a connection portion.

A positional relationship between the HD 91 and the connection portion 97 will be described with reference to FIG. 8. A of FIG. 8 is an enlarged view centered on a portion of the connection portion 97 illustrated in FIG. 7. The connection portion 97 is formed on the sidewall film 85 between the FD 91-1 and the FD 91-2, as described above. Further, an upper surface (an upper surface in FIG. 8 and a surface opposite to the light incidence surface side) of the connection portion 97, an upper surface of the FD 91-1, and an upper surface of the FD 91-2 are formed to be the same surface. Although description will be continued herein in a case in which the upper surface of the FD 91-1 and the upper surface of the FD 91-2 are formed to be the same surface, the upper surfaces may be formed to different heights. Further, the present technology is also applicable to a case in which the height is made unintentionally different, for example, at the time of fabrication.

A length from the upper surface to a lower surface, of the connection portion 97 is a depth a, and a length from the upper surface, to a lower surface of the FD 91 is a depth b. The connection portion 97 is formed so that the depth a of the connection portion 97 is shorter (shallower) than the depth b of the FD 91. When the depth b of the FD 91 is 100%, the connection portion 97 is formed so that the depth a of the connection portion 97 falls within a range from 50% to 80%, for example.

When the depth a of the connection portion 97 is formed to be shallower than 50% of the depth b of the FD 91, the contact of the FD wiring 98 is likely to penetrate the connection portion 97. Further, a portion in which the contact of the FD wiring 98 and the connection portion 97 are in contact with each other is shortened, and the charge from the FD 91 is highly likely not to be read out properly. Thus, it is assumed herein that the depth a of the connection portion 97 is equal to or greater than 50% of the depth b of the FD 91, for example.

When the connection portion 97 or the contact of the FD wiring 98 can be formed so that there is not such a concern, the connection portion 97 is formed so that the depth a of the connection portion 97 is shallower than 50% of the depth b of the FD 91.

Further, when the connection portion 97 is formed so that the depth a of the connection portion 97 is deeper than 80% of the depth b of the FD 91, charge is highly likely to leak from the connection portion 97 to the active area 77. For example, when the connection portion. 97 is formed so that the depth a of the connection portion 97 is deeper than 80% of the depth b of the FD 91 (formed to a depth of 100% or more), there is a portion in which the connection portion 97 and the active area 77 are in contact with each other, and leaking from the portion is highly likely to occur.

In order to prevent such leaking, it is assumed herein that the depth a of the connection portion 97 is equal to or smaller than 80% of the depth b of the FD 91, for example.

When the connection portion 97 or the contact of the FD wiring 98 can be formed so that there is not such a concern, the connection portion 97 is formed so that the depth a of the connection portion 97 is deeper than 80% of the depth b of the FD 91.

The connection portion 97 can be formed so that the bottom surface has a linear shape as illustrated in A of FIG. 8, but can also be formed so that the bottom surface has an arc shape as illustrated in B of FIG. 8. The connection portion 97 illustrated in B of FIG. 8 is formed so that the bottom surface has an arc shape and the outer side of the arc is surrounded by the sidewall film 85 and does not come into contact the active area 77.

When the bottom surface of the connection portion 97 has an arc shape, a depth c of the connection portion 97 can be defined as a length from the upper surface of the connection portion 97 to a deepest position of the bottom surface, as illustrated in B of FIG. 8. When the depth c of the connection portion 97 is defined in this way, the connection portion 97 is formed so that the depth c of the connection portion 97 fans within a range from 50% to 100%, for example.

This is because, when the connection portion 97 is formed so that the depth a of the connection portion 97 is equal to or greater than 50% of the depth b of the FD 91, a reliable connection with the contact of the FD wiring 98 is maintained, as in the case described above. Even when the connection portion 97 is formed deeply so that the depth c of the connection portion 97 is about 100% of the depth b of the FD 91, the connection portion 97 can be formed so that a tip portion of the connection portion 97 does not comes into contact with the active area 77 as illustrated in B of FIG. 8, and therefore, it is possible to prevent charge from leaking from the connection portion 97 to the active area 77.

When the bottom surface of the connection portion 97 is formed in an arc shape as illustrated in B of FIG. 8, it is possible to form the connection portion 97 deeply.

In the following description, a case in which the upper surface and the lower surface of the connection portion 97 are both formed in a linear shape as illustrated in A of FIG. 8 is illustrated and description thereof will be continued.

Because two of the four side surfaces of the connection portion 97 are in contact with the FD 91, the side surfaces of the connection portion 97 are within an N+ area. Further, two of the four side surfaces of the connection portion 97 are in contact with the sidewall film 85. Further, the bottom surface of the connection portion 97 is in contact with the sidewall film 85.

Thus, because the connection portion 97 is surrounded by the FD 91 or the sidewall film 85 (for example, SiO2) in a state in which the connection portion 97 is in contact with the FD 91 or the sidewall film 85, an increase in leakage of the FD 81 due to an interface level does not occur regardless of a depletion layer.

The contact of the FD wiring 98 can be connected to the connection portion 97. As a fourth embodiment, because the pixel 50*d* described with reference to FIG. 13 has a configuration in which the contact of the FD wiring 98 is connected to the FD 91, it is necessary for an area of the FD 91 to be formed to be large so that the contact and the transfer transistor 90 are separated from each other and do not come into contact with each other.

In the pixel 50*a* according to the first embodiment, the contact of the FD wiring 98 is connected to the connection portion 97, making it possible to form the contact and the transfer transistor 90 in positions separated by at least the FD 91.

Thus, it is possible to reduce the area of the FD 91 as compared with the case in which the contact of the FD wiring 98 is connected to the FD 91. Even when the connection portion 97 is formed and the FD 91-1, the connection portion 97, and the FD 91-2 are connected, as a result, it is possible to make the FD area small and improve the conversion efficiency.

Fabrication of Connection Portion

Fabrication of the pixel 50*a*, particularly, fabrication of the connection portion 97 will be described with reference to FIG. 9.

In step S11, the through DTI 82 opens in the Si substrate 70. Areas other than a position in which the through DTI 82 is formed on the Si substrate 70 are covered with a hard mask configured using the SiN film 111 and the SiO2 film 112. Using dry etching, a groove opening in a vertical direction to a predetermined depth is formed in a portion of the Si substrate 70 not covered with the hard mask.

Then, an SiO2 film containing P (phosphorus), which is an N-type impurity, is formed inside the open groove, and then heat treatment is performed so that the Si substrate 70 is doped with P (phosphorus) from the SiO2 film (referred to as solid phase diffusion).

Then, the SiO2 film containing P (phosphorus) formed inside the open groove is removed, and then heat treatment is performed again so that P (phosphorus) is diffused to the inside of the Si substrate 70 and the N-type solid phase diffusion layer 84 self-aligned with a current shape of the groove is formed.

Next, an SiO2 film containing B (boron), which is a P-type impurity, is formed inside the groove, and then heat treatment is performed so that the B (boron) is solid phase diffused from the SiO2 film to the Si substrate 70 and the P-type solid phase diffusion layer 83 self-aligned with the shape of the groove is formed.

The SiO2 film containing B (boron) formed on an inner wall of the groove is then removed. Thus, the Si substrate 70 in which the trench serving as the through DTI 82, the P-type solid phase diffusion layer 83, and the N-type solid phase diffusion layer 84 have been formed is prepared.

In step S12, the sidewall film 85 made of SiO2 is formed on the inner wall of the open groove, and the groove is filled with polysilicon so that the through DTI 82 is formed.

In step S13, the sidewall film 85 in which the connection portion 97 is to be formed, in this case, SiO2, is etched by lithography and etching.

In step S14, polysilicon 97' is deposited on all surfaces.

In step S15, the polysilicon 97' is etched back into a shape in which an upper portion of the trench is filled with polysilicon.

In step S16, the SiN (silicon nitride film) 111 and the SiO2 film 112 are removed so that a trench of a portion serving as the gate of the transfer transistor 90 including a vertical trench is formed. After the trench is formed, the SiO2 film 99 is formed again. After the film formation, the transfer transistor 90 is formed.

After the portion serving as the gate of the transfer transistor 90 is formed, impurities are implanted into a portion serving as the FD 91 over the gate so that the N+ diffusion layer is formed. Further, in this case, impurities are also implanted into the polysilicon in an upper portion of the trench so that the polysilicon is doped to become an N-type. Thus, the FD 91 and the connection portion 97 are formed.

When the N+ diffusion layer serving as the FD 91 is formed, impurity implantation is performed so that a bottom portion of the N+ diffusion layer is formed in a deeper position than a bottom portion of the polysilicon. After the connection portion 97 is formed, the contact of the FD wiring 98 is formed in a portion of the connection portion 97, in this case, on polysilicon.

The pixel 50a having the connection portion 97 is fabricated through the steps described above.

Thus, in the pixels 50a according to the first embodiment, the FDs 91 of adjacent pixels 50a can be connected by the connection portion 97, making it possible for the FDs 91 of adjacent pixels 50a to be put in an electrically connected state. Thus, a contact portion between the FD 91 and the contact of the FD wiring 98 may be provided at one place, and need not to be provided in each pixel 50a. Thus, it is possible to reduce the area (FD diffusion layer) of the FD 91. As a result, it is possible to curb the FD capacity, improve the conversion efficiency, and enhance the S/N ratio.

Example of Configuration of Pixel in Second Embodiment

FIG. 10 is a diagram illustrating an example of a configuration of a pixel 50b according to a second embodiment. Because a basic configuration of the pixel 50b illustrated in FIG. 10 is the same as that of the pixel 50a illustrated in FIG. 4, the same portions are denoted by the same reference signs and description thereof will be omitted.

A difference is that a size of an FD 91b of the pixel 50b illustrated in FIG. 10 is smaller than that of the FD 91 of the pixel 50a illustrated in FIG. 4 (hereinafter, the FD 91 of the pixel 50a is referred to as an FD 91a).

Referring back to the pixel 50a illustrated in FIG. 4, the FD 91a of the pixel 50a is formed so that a width. (a length in a horizontal direction in FIG. 4) of the FD 91a of the pixel 50a is longer than that of the connection portion 97. The FD 91b of the pixel 50b illustrated in FIG. 10 is formed so that a width of the FD 91b of the pixel 50b is approximately the same as that of the connection portion 97.

A portion in which the FD 91b and the connection portion 97 are in contact with each other may be formed with the same size, as illustrated in FIG. 10.

In the pixel 50b in the second embodiment, the FDs 91b of adjacent pixels 50b are connected by the connection portion 97, making it possible for the FDs 91b of adjacent pixels 50b to enter an electrically connected state, as in the pixel 50a in the first embodiment. Further, a contact portion for the contact of the FD wiring 98 can be provided in the connection portion 97.

Thus, it is possible to make the area (the FD diffusion layer) of the FD 91 small and, as a result, to curb the FD capacity, improve the conversion efficiency, and enhance the S/N ratio.

Example of Configuration of Pixels in Third Embodiment

FIG. 11 is a diagram illustrating an example of a configuration of a pixel 50c in a third embodiment. Because a basic configuration of the pixel 50c illustrated in FIG. 11 is the same as that of the pixel 50a illustrated in FIG. 4, the same portions are denoted by the same reference signs and description thereof will be omitted.

A difference is that a gate of a transfer transistor 90 of the pixel 50c illustrated in FIG. 11 is formed on an active area 77, and the gate of the transfer transistor 90 of the pixel 50a illustrated in FIG. 4 is formed on the STI 78.

In a plan view of the pixel 50c illustrated in FIG. 11, an active area 77c-1 is located around the transfer transistor 90-1, and the STI 78 is located outside the active area 77c-i. Similarly, an active area 77c-2 is located around the transfer transistor 90-2, and the STI 78 is located outside the active area 77c-2.

This is illustrated in a cross-sectional view as in FIG. 12. FIGS. 12A and 12B illustrate a plan view and a cross-sectional view of the vicinity of the transfer transistor 90 (hereinafter, referred to as a transfer transistor 90a) of the pixel 50a in the first embodiment for comparison.

A of FIG. 12 is a plan view of the vicinity of the transfer transistor 90a of the pixel 50a, and B of FIG. 12 is a cross-sectional view of the vicinity of the transfer transistor 90*a* corresponding to a position of a line segment c-c' in A of FIG. 12.

A portion of the transfer transistor 90*a* other than a portion in contact with an FD 91 is in contact with an STI 78*a*, as illustrated in A of FIG. 12. The transfer transistor 90*a* is formed so that both ends of the transfer transistor 90*a* are located on the STI 78*a* when viewed in cross section, as illustrated in B of FIG. 12.

C of FIG. 12 is a plan view of the vicinity of a transfer transistor 90*c* of the pixel 50*c*, and D of FIG. 12 is a cross-sectional view of the vicinity of the transfer transistor 90*c* corresponding to a position of a line segment d-d' in C of FIG. 12.

A portion of the transfer transistor 90*c* other than a portion in contact with an FD 91 is in contact with the active area 77*c*, as illustrated in C of FIG. 12. When viewed in cross section, the transfer transistor 90*c* is formed to be located on the active area 77*c* and is formed in a state in which the transfer transistor 90*c* is not in contact with an STI 78*c*, as illustrated in D of FIG. 12.

Thus, the transfer transistor 90*c* can be configured to be formed on the STI 78 or can be configured to be formed on the active area 77.

Referring back to FIG. 11, a case in which, for the FD 91 of the pixel 50*c* illustrated in FIG. 11, the FD 91*b* of the second embodiment is applied, and a portion in which the FD 91*b* and the connection portion 97 are in contact with each other is formed with the same size as that of the connection portion 97 is shown.

The FD 91*a* of the first embodiment may be applied to the third embodiment, and a portion in which the FD 91*a* and the connection portion 97 are in contact with each other may be formed to be larger than the connection portion 97. That is, the third embodiment can be configured to be combined with the first embodiment or the second embodiment.

In the pixel 50*c* according to the third embodiment, the FDs 91 of the adjacent pixels 50*c* can be connected by the connection portion 97, making it possible for the FDs 91 of the adjacent pixels 50*c* to be put in an electrically connected state, as in the pixel 50*a* according to the first embodiment, and the contact portion for the contact of the FD wiring 98 can be provided in the connection portion 97.

Thus, it is possible to make the area (the FD diffusion layer) of the FD 91 small and, as a result, to curb the FD capacity, improve the conversion efficiency, and enhance the S/N ratio.

Example of Configuration of Pixels in Fourth Embodiment

FIG. 13 is a diagram illustrating an example of a configuration of a pixel 50*d* according to a fourth embodiment. Because a basic configuration of the pixel 50*d* illustrated in FIG. 13 is the same as that of the pixel 50*a* illustrated in FIG. 4, the same portions are denoted by the same reference signs and description thereof will be omitted.

A difference is that an FD wiring 98*d* of a pixel 50*d* illustrated in FIG. 13 is connected to an FD 91*d*, and the FD wiring 98 of the pixel 50*a* illustrated in FIG. 4 is connected to the connection portion 97.

In a plan view of the pixel 50*d* illustrated in FIG. 13, the FD wiring 98*d* is connected to an FD 91*d*-2 of a pixel 50*d*-2. Further, because the FD wiring 98*d* is connected to the FD 91*d*-2, the FD 91*d*-2 is formed to be larger than the FD 91*d*-1 to which the FD 98*d* is not connected.

The FD wiring 98*d* can be configured to be connected to the FD 91*d*, as in the pixel 50*d*.

In the pixels 50*d* according to the fourth embodiment, the FDs Old of the adjacent pixels 50*d* can be connected by the connection portion 97, making it possible for the FDs 91*d* of the adjacent pixels 50*d* to be put in an electrically connected state, as in the pixel 50*a* in the first embodiment.

Further, because it is not necessary for the contact portion for the contact of the FD wiring 98 to be provided in each pixel 50*d*, it is possible to reduce the area (the FD diffusion layer) of the FD 91 as compared with the case in which the contact portion for the contact of the FD wiring 98 is provided in each pixel 50*d*. As a result, it is possible to curb the FD capacity, improve the conversion efficiency, and enhance the S/N ratio.

Further, thus, a connection place of the FD wiring 98 may be the connection portion 97 or may be the FD 91, which can increase a degree of freedom in design of wirings.

Example of Configuration of Pixel in Fifth Embodiment

FIG. 14 is a diagram illustrating an example of a configuration of a pixel 50*e* according to a fifth embodiment. Because a basic configuration of the pixel 50*e* illustrated in FIG. 14 is the same as that of the pixel 50*a* illustrated in FIG. 4, the same portions are denoted by the same reference signs and description thereof will be omitted.

A case in which, in the pixels 50*a* to 50*d* in the first to fourth embodiments described above, the FDs 91 are connected by the connection portion 97 has been described by way of example. Further, a case in which a GND area is connected in the pixel 50*e* in the fifth embodiment will be described.

A GND area 201-1 is formed in a pixel 50*e*-1 illustrated in FIG. 14, and a GND area 201-2 is formed in the pixel 50*e*-2. This GND area 201 can be formed as a P+ diffusion layer. A GND contact 96*e* is formed in an area in which the GND area 201-1 and the GND area 201-2 are connected to each other.

The GND contact 96*e* is formed on the through DTI 82 between the pixel 50*e*-1 and the pixel 50*e*-2, like the connection portion 97. The GND contact 96*e* can be formed as a P+ diffusion layer, like the GND area 201.

Further, the GND contact 96*e* is formed of polysilicon, like the connection portion. 97, and can be formed by a P+ impurity being implanted when the GND area 201 is formed as a P+ diffusion layer.

With the configuration as in the pixel 50*e*, it is not necessary for the GND contact 96 to be formed in each pixel 50*e*. Thus, it is possible to form large transistors that are disposed in the pixel 50*e* or dispose a large number of transistors.

An example in which the pixel 50*e* illustrated in FIG. 14 is combined with the pixel 50*a* (FIG. 4) of the first embodiment has been shown, but the pixel 50*e* may be combined with the pixels 50*b* to 50*d* of the second to fourth embodiments.

Thus, in the present, technology, the FD 91 can be connected by the connection portion 97 formed on the trench, and the GND area 201 can be connected by the GND contact 96 formed on the trench.

In other words, a configuration in which predetermined areas such as the FDs 91 or the GND areas 201 of the adjacent pixels 50 are connected to each other by the area formed on the trench is adopted, making it possible to treat the predetermined areas as one area.

Further, the predetermined areas are the same impurity areas, and the area formed on the trench is also the same impurity area as the predetermined areas. Further, the predetermined areas are connected to each other by the areas formed on the trenches to thereby become areas at the same potential, and areas desired to be such areas at the same potential can be connected to each other by the areas formed on the trenches.

Example of Configuration of Pixel in Sixth Embodiment

FIG. 15 is a diagram illustrating an example of a configuration of a pixel 50*f* in a sixth embodiment. Because a basic configuration of the pixel 50*f* illustrated in FIG. 15 is the same as that of the pixel 50*a* illustrated in FIG. 4, the same portions are denoted by the same reference signs and description thereof will be omitted.

A difference is that the connection portion 97*f* of the pixel 50*f* illustrated in FIG. 15 is formed to be larger than the connection portion 97 of the pixel 50*a* illustrated in FIG. 4.

Reference is made to a cross-sectional view of the pixel 50*f* illustrated in FIG. 16. The connection portion 97*f* is the same as the connection portion 97 of the pixel 50*a* in the first embodiment illustrated in FIG. 7 in that the connection portion 97*f* is formed on the through DTI 82.

On the other hand, a difference is that the connection portion 97 of the pixel 50*a* illustrated in FIG. 7 is entirely formed within the Si substrate 70, whereas a portion of the connection portion 97*f* of the pixel 50*f* illustrated in FIG. 16 is formed in the Si substrate 70 and the other portion thereof is formed on the Si substrate 70 (within a wiring layer (not illustrated)).

Further, the connection portion 97*f* is formed with the same height as a gate of the transfer transistor 90 (a vertical direction in FIG. 16). The connection portion 97*f* is in contact with the FD 91*f*-1 and the FD 91*f*-2 in a portion that is formed as a buried type, and is also in contact with the FD 91*f*-1 and the FD 91*f*-2 in a portion that is not a buried type portion formed on the Si substrate 70.

In other words, the connection portion 97*f* is in contact with a side surface of the FD 91*f* and also in contact with an upper surface of the FD 91*f*. That is, in this case, the connection portion 97*f* is in contact with the FD 91*f* on two sides.

Referring to a plan view of FIG. 15, the connection portion 97*f* is formed to have a portion overlapping with the FD 91*f*-1 and also to have a portion overlapping with the FD 91*f*-2. That is, the connection portion 97*f* is formed to be larger than the connection portion 97 (FIG. 4) of the pixel 50*a*. When the connection portion 97*f* is formed to be large as described above, the connection portion 97*f* and the FD 91*f* can be in contact with each other even when misalignment occurs.

Fabrication of Connection Portion

The fabrication of the pixel 50*f*, particularly the fabrication of the connection portion 97*f* will be described with reference to FIG. 17.

In step S51, the Si substrate 70 in which the trench serving as the through DTI 82, the P-type solid phase diffusion layer 83, and the N-type solid phase diffusion layer 84 have been formed is prepared. Because this step S51 is the same as step S11 (FIG. 9), description thereof is omitted.

In step S52, SiO2 and polysilicon are deposited on all surfaces of the Si substrate 70, including the inside of the trench and etched back. SiO2 is then deposited on all the surfaces again and etched back. Through this step, the inside of the trench is put in a state in which the SiO2 layer and the polysilicon layer are laminated (filled). The SiO2 layer is a portion serving as the sidewall film 85, and the polysilicon layer is a portion serving as the filling material 86.

Then, the SiN film is removed and, for example, phosphorus is ion-implanted in order to form an N+ diffusion layer serving as a portion of the FD 91 on a surface of the Si substrate 70 around the trench (around the through DTI 82). In this case, ion implantation into, for example, a portion serving as the PD 71 may also be performed. After the ion is implanted, a portion serving as a vertical transistor portion of the gate of the transfer transistor 90 is formed by etching, the SiO2 film is removed, and then, the entire surface is gate-oxidized.

In step S53, using lithography and etching, a resist 151 is formed so that only the portion in which the connection portion 97*f* is to be formed is open, and the SiO2 film in the portion in which the connection portion 97*f* is to be formed is removed.

In step S54, the resist 151 is removed, and then, a polysilicon 152 doped with the phosphorus is deposited on an entire surface of the Si substrate 70, including the inside of the trench.

In step S55, the deposited polysilicon 152 is patterned by lithography and dry etching. When the deposited polysilicon 152 is patterned, a portion serving as the gate of the transfer transistor 90, which includes the vertical transistor, is formed. Further, the connection portion 97*f* is also formed. Thus, in the pixel 50*f* according to the sixth embodiment, the gate of the transfer transistor 90 and the connection portion 97*f* are formed at the same time.

In step S56, for example, phosphorus ion implantation is performed so that an N+ diffusion layer is formed in the Si substrate 70 located beside the gate of the transfer transistor 90, that is, in a portion serving as the FD 91 (the portion serving as the FD 91 together with a portion of the FD 91 formed in step S52). The contact of the FD wiring 79 is then formed in the polysilicon 152 doped with the phosphorus, which is a portion serving as the connection portion 97.

Through the steps as described above, the pixel 50*f* having the connection portion 97*f* is fabricated.

In the pixels 50*f* according to the sixth embodiment, the FDs 91*f* of the adjacent pixels 50*f* can be connected by the connection portion 97*f* making it possible for the FDs 91*f* of the adjacent pixels 50*f* to be put in an electrically connected state, as in the pixel 50*a* in the first embodiment. Further, the contact portion for the contact of the FD wiring 98*f* can be provided in the connection portion 97*f*.

Thus, it is possible to make the area of the FD 91*f* (the FD diffusion layer) small and, as a result, to curb the FD capacity, improve the conversion efficiency, and enhance the S/N ratio.

The fifth embodiment is applied to the pixel 50*f* in the sixth embodiment, and the GND areas formed in the pixel 50*f*-1 and the pixel 50*f*-2 are connected by a GND contact formed on the through DTI 82.

Example of Configuration of Pixels in Seventh Embodiment

FIGS. 18 to 20 are diagrams illustrating an example of a configuration of a pixel 50*g* in a seventh embodiment. A case in which two pixels are shared in the pixel 50 in the first to sixth embodiments described above has been described by way of example, but the present technology is not limited to sharing two pixels and can also be applied to a case in which a transistor or the like is shared in two or more pixels.

A case in which four pixels are shared will be described by way of example as a seventh embodiment. FIG. 18 is a diagram illustrating an example of an arrangement of unit pixels 50 arranged in a matrix in a pixel array unit 41, and an example of an arrangement when four pixels are shared.

In the pixel array unit 41, a plurality of unit pixels 50g are arranged in a matrix. In FIG. 18, 16 (4×4) pixels 50g disposed in the pixel array unit 41 are illustrated. A reset transistor, an amplification transistor, and a selection transistor are shared and an FD is shared in four pixels, as will be described below with reference to FIG. 19.

In FIG. 18, a total of four pixels 50g including two pixels 50g arranged in a vertical direction and two pixels 50g arranged in a horizontal direction are shared pixels. Pixels 50g-1, 50g-2, 50g-3, and 50g-4 arranged in a 2×2 array are shared pixels. Similarly, pixels 50g-5, 50g-6, 50g-7, and 50g-8 arranged in a 2×2 array are shared pixels.

Similarly, pixels 50g-9, 50g-10, 50g-11, and 50g-12 arranged in a 2×2 array are shared pixels. Similarly, pixels 50g-18, 50g-14, 50g-15, and 50g-16 arranged in a 2×2 array are shared pixels.

When it is not necessary to individually distinguish the pixels 50g-1 to 50g-16, the pixels 50g-1 to 50g-16 are simply described as a pixel 50g. Other portions are described in the same manner.

FIG. 19 is a plan view of four shared pixels. In FIG. 19, the pixels 50g-1 to 50g-4 are illustrated as 4 pixels of 2×2 arranged in a vertical direction and a horizontal direction, and description thereof will be continued. Because a basic configuration is the same as that of the pixel 50a at the time of sharing of the two pixels illustrated in FIG. 3, description of the same portions will be appropriately omitted.

In FIG. 19, one square represents one pixel 50g. The pixel 50g includes a photodiode (PD) 71, and a through DTI 82 is disposed to surround the PD 71.

A transfer transistor 90g-1, an FD 91g-1, a reset transistor 92g, and a GND contact 96g-1 are formed on the front surface side of the pixel 50g-1. A transfer transistor 90g-2, an FD 91g-2, a selection transistor 94g, and a GND contact 96g-2 are formed on the front surface side of the pixel 50g-2.

A transfer transistor 90g-3, an FD 91g-3, an amplification transistor 93g-1, and a GND contact 96g-3 are formed on the front surface side of the pixel 50g-3. A transfer transistor 90g-4, an FD 91g-4, an amplification transistor 93g-2, and a GND contact 96g-4 are formed on the front surface side of the pixel 50a-4.

The reset transistor 92g, the amplification transistor 93g, and the selection transistor 94g are configured to be shared by the pixels 50g-1 to 50g-4. The amplification transistor 93g includes an amplification transistor 93g-1 disposed in the pixel 50g-3 and an amplification transistor 93g-2 disposed in the pixel 50g-4.

Because sharing a plurality of transistors among the four pixels 50g allows the number of transistors to be disposed in one pixel to be reduced, it is possible to increase a size of an area in which one transistor is disposed. Effects such as noise reduction can be obtained by the transistors being configured to be large.

Further, when the amplification transistor 93g includes the amplification transistor 93g-1 and the amplification transistor 93g-2 disposed in the two pixels, it is possible to assign a larger area to the amplification transistor 93g and further reduce noise, as illustrated in FIG. 19.

The FD 91g-1 of the pixel 50g-1, the FD 91g-2 of the pixel 50g-2, the FD 91g-3 of the pixel 50g-3, and the FD

91g-4 of the pixel 50g-4 are connected by a connection portion 97g formed in a portion of the through DTI 82 and configured to function as one FD 91g. The FD wiring 98g is connected to the connection portion 97g.

The FD wiring 98g is also connected to the reset transistor 92g, the amplification transistor 93g-1, and the amplification transistor 93g-2. Further, a portion of the FD wiring 98g is formed on the through DTI 82.

FIG. 20 is a cross-sectional view in a vertical direction of the pixel 50g, which corresponds to a position of a line segment A-A' in FIG. 19. Because a configuration of a cross section of the pixel 50g is the same as the configuration of the cross section of the pixel 50a illustrated in FIG. 7, detailed description thereof will be omitted.

The FD 91g is formed in an area adjacent to the transfer transistor 90g (the transfer gate 90g). In FIG. 20, the FD 91g-1 is formed on the right side of the transfer transistor 90g-1 of the pixel 50g-1 illustrated on the left side, and in FIG. 20, the FD 91a-4 is formed on the left side of the transfer transistor 90g-4 of the pixel 50g-4 illustrated on the right side.

The connection portion 97g is formed between the FD 91g-1 and the FD 91g-4. The connection portion 97g is on the through DTI 82 and is formed within the Si substrate 70. The through DTI 82 is formed between the pixel 50g-1 and the pixel 50g-4, as described with reference to FIGS. 18 and 19. The sidewall film 85 in an upper portion of the through DTI 82 is partially removed, and the connection portion 97g is formed in a portion in which the sidewall film 85 in the upper portion of the through. DTI 82 is partially removed.

The connection portion 97g is formed of, for example, polysilicon. Further, the connection portion 97g is the same semiconductor area as that for the FD 91g. For example, when the FD 91g is an N-type semiconductor area, the connection portion 97g is also formed of an N-type semiconductor area.

The FD 91g-1, the connection portion. 97a, and the FD 91g-4 are formed to be a continuous N+ diffusion layer. In other words, because the FD 91g-1 and the connection portion 97g are in a connected state and the FD 91g-4 and the connection portion 97g are in the connected state, the FD 91g-1 and the FD 91g-4 are put in the connected state via the connection portion 97g.

Thus, the FD 91g-1, the connection portion 97g, and the FD 91g-4 exist as one N+ diffusion layer and can be treated as one FD 91g. Such an FD 91g is shared by the pixel 50a-1 and the pixel 50g-4.

Because the FD 91g-2 of the pixel 50g-2 and the FD 91g-3 of the pixel 50g-3 are also connected to the connection portion 97g, which is not illustrated in FIG. 20, the FDs 91g-1 to 91g-4 and the connection portion 97g exist as one N+ diffusion layer and can be treated as one FD 91g. Such an FD 91g is shared by the pixels 50g-1 to 50g-4.

The FD wiring 98g (a contact that is a portion of the FD wiring 98g) is connected to the connection portion 97g. The FD wiring 98g is connected to the gate of the amplification transistor 93g, as described with reference to FIG. 19. The charge read out from the PD 71 by the transfer transistor 90g flows to a wiring layer (not illustrated) via the FD 91g and the FD wiring 98g so that a gate potential of the amplification transistor 93g is changed.

Thus, the present technology can be applied to the case in which four pixels are shared. Although the case in which two pixels are shared and the case in which four pixels are shared have been described by way of example in the present specification, the present technology is also applied to a case in which a plurality of pixels such as eight pixels are shared.

In the case in which four pixels are shared, the FDs 91g of the adjacent pixels 50g are connected by the connection portion 97g as in the case in which two pixels are shared, making it possible for the FDs 91g of the adjacent pixels 50g to be put in an electrically connected state. Further, the contact portion for the contact of the FD wiring 98g can be provided in the connection portion 97g.

Thus, it is possible to make the area (the FD diffusion layer) of the FD 91g small and, as a result, to curb the FD capacity, improve the conversion efficiency, and enhance the S/N ratio.

the seventh embodiment in which four pixels are shared can be applied in combination with any one of the first to sixth embodiments.

Although a case in which the P-type solid phase diffusion layer 83 and the N-type solid phase diffusion layer 84 are formed in the through DTI 82 and the strong electric field area is formed has been described by way of example in the embodiments described above, the present technology can also be applied to pixels in which the strong electric field area is not formed.

Example of Application to Endoscopic Surgery System

Further, for example, a technology (the present technology) according to the present disclosure may be applied to an endoscopic surgery system.

FIG. 21 is a diagram illustrating an example of a schematic configuration of an endoscopic surgery system to which the technology according to the present disclosure (the present technology) can be applied.

In FIG. 21, a state in which a surgeon (a doctor) 11131 is operating on a patient 11132 on a patient bed 11133 using an endoscopic surgery system 11000 is illustrated. The endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted, as illustrated in FIG. 21.

The endoscope 11100 includes a lens barrel 11101 of which an area having a predetermined length from a tip thereof is inserted into a body cavity of the patient 11132, and a camera head 11102 connected to a base end of the lens barrel 11101. In the illustrated example, the endoscope 11100 configured as a so-called rigid endoscope having the rigid lens barrel 11101 is illustrated, but the endoscope 11100 may be configured as a so-called flexible endoscope having a flexible lens barrel.

An opening in which an objective lens is fitted is provided at the tip of the lens barrel 11101. A light source device 11203 is connected to the endoscope 11100, and light generated by the light source device 11203 is guided to the tip of the lens barrel by a light, guide extending inside the lens barrel 11101 and radiated toward an observation target in the body cavity of the patient 11132 via the objective lens. The endoscope 11100 may be a direct-viewing endoscope or may be a perspective mirror or a side-viewing endoscope.

An optical system and an image sensor are provided inside the camera head 11102, and reflected light (observation light) from the Observation target is condensed on the image sensor by the optical system. The observation light is photoelectrically converted by the image sensor, and an electrical signal corresponding to the observation light, that is, an image signal corresponding to an observation image is generated. The image signal is transmitted as RAW data to a camera control unit (CCU) 11201.

The CCU 11201 is configured of a central processing unit (CPU), a graphics processing unit (CPU), or the like, and performs overall control of operations of the endoscope 11100 and a display device 11202. Further, the CCU 11201 receives the image signal from the camera head 11102, and performs various types of image processing for displaying an image based on the image signal, such as development processing (de mosaic processing), on the image signal.

The display device 11202 displays the image based on the image signal subjected to the image processing by the CCU 11201 under the control of the CCU 11201.

The light source device 11203 is configured using, for example, a light source such as a light emitting diode (LED), and supplies the endoscope 11100 with irradiation light when a surgical site or the like is photographed.

An input device 11204 is an input interface for the endoscopic surgery system 11000. A user can input various types of information or instructions to the endoscopic surgery system 11000 via the input device 11204. For example, the user inputs an instruction to change imaging conditions (a type of irradiation light, magnification, focal length, or the like) according to the endoscope 11100.

A treatment tool control device 11205 controls driving of the energy treatment tool 11112 for cauterization or incision of a tissue, sealing of blood vessel, or the like. A pneumoperitoneum device 11206 sends a gas into the body cavity of the patient 11132 via the pneumoperitoneum tube 11111 in order to inflate the body cavity of the patient 11132 for the purpose of securing a field of view using the endoscope 11100 and a working space of the surgeon. A recorder 11207 is a device capable of recording various types of information on surgery. A printer 11208 is a device capable of printing various types of information on surgery in various formats such as text, images, and graphs.

The light source device 11203 that supplies the endoscope 11100 with the irradiation light when a surgical site is photographed can be configured using, for example, an LED, a laser light source, or a white light source configured using a combination thereof. When a white light source is configured in a combination of RGB laser light sources, an output intensity and an output timing of each color (each wavelength) can be controlled with high accuracy and thus, adjustment of the white balance of the captured image can be performed in the light source device 11203. Further, in this case, the observation target is irradiated with laser light from the respective RGB laser light sources in a time division manner, and driving of the image sensor of the camera head 11102 is controlled in synchronization with an irradiation timing such that images corresponding to the respective RGB can also be captured in a time division manner. According to this method, it is possible to obtain a color image without providing a color filter in the image sensor.

Further, driving of the light source device 11203 may be controlled so that an intensity of output light is changed at predetermined time intervals. The driving of the image sensor of the camera head 11102 is controlled in synchronization with a timing of changing the intensity of the light, and images are acquired in a time division manner and combined, such that an image having a high dynamic range without so-called blackout and whiteout can be generated.

Further, the light source device 11203 may be configured to be able to supply light having a predetermined wavelength band corresponding to special light observation. In the special light observation, for example, so-called narrow band imaging in which a predetermined tissue such as a blood vessel of a mucosal surface layer is imaged with high contrast through irradiation with light in a narrower band than irradiation light (that is, white light) at the time of normal observation using a dependence of absorption of light in a body tissue on a wavelength is performed. Alternatively, in the special light observation, fluorescence observation in which an image is obtained using fluorescence generated through excitation light irradiation may be performed. In the fluorescence observation, a body tissue can be irradiated with excitation light and fluorescence from the body tissue can be observed (autofluorescence observation), or a reagent such as indocyanine green (ICG) can be locally injected into a body tissue and the body tissue can be irradiated with excitation light corresponding to a fluorescence wavelength of the reagent so that a fluorescence image is obtained. The light source device 11203 can be configured to be able to supply narrowband light and/or excitation light corresponding to such special light observation.

FIG. 22 is a block diagram illustrating an example of a functional configuration of the camera head 11102 and the CCU 11201 illustrated in FIG. 21.

The camera head 11102 includes a lens unit 11401, an imaging unit 11402, a driving unit 11403, a communication unit 11404, and a camera head control unit 11405. The CCU 11201 has a communication unit 11411, an image processing unit 11412, and a control unit 11413. The camera head 11102 and the CCU 11201 are communicatively connected to each other by a transmission cable 11400.

The lens unit 11401 is an optical system provided in a connection portion for connection to the lens barrel 11101. Observation light taken from a tip of the lens barrel 11101 is guided to the camera head 11102 and is incident on the lens unit 11401. The lens unit 11401 is configured in combination of a plurality of lenses including a zoom lens and a focus lens.

The number of image sensors constituting the imaging unit 11402 may be one (so-called single-plate type) or may be plural (so-called multi-plate type). When the imaging unit 11402 is configured in a multi-plate type, for example, image signals corresponding to RGB may be generated by respective image sensors and combined so that a color image may be obtained. Alternatively, the imaging unit 11402 may be configured to include a pair of image sensors for acquiring image signals for a right eye and a left eye corresponding to a 3D (dimensional) display. The performed 3D display allows the surgeon 11131 to more accurately ascertain a depth of a living tissue in the surgical site. When the imaging unit 11402 is configured in a multi-plate type, a plurality of systems of lens units 11401 may be provided in correspondence to the image sensors.

Further, the imaging unit 11402 does not necessarily have to be provided in the camera head 11102. For example, the imaging unit 11402 may be provided immediately after the objective lens inside the lens barrel 11101.

The driving unit 11403 includes an actuator and moves the zoom lens and the focus lens of the lens unit 11401 by a predetermined distance along an optical axis under the control of the camera head control unit 11405. This allows a magnification and a focus of the image captured by the imaging unit 11402 to be adjusted appropriately.

The communication unit 11404 is configured using a communication device for transmitting and receiving various types of information to and from the CCU 11201. The communication unit 11404 transmits the image signal obtained from the imaging unit 11402 as RAW data to the CCU 11201 via the transmission cable 11400.

Further, the communication unit 11404 receives a control signal for controlling driving of the camera head 11102 from the CCU 11201 and supplies the control signal to the camera head control unit 11405. The control signal includes, for example, information on imaging condition, such as information indicating that a frame rate of the captured image is designated, information indicating that an exposure value at the time of imaging is designated, and/or information indicating that the magnification and focus of the captured image is designated.

The imaging conditions such as the frame rate, the exposure value, the magnification, and the focus may be appropriately designated by the user or may be automatically set by the control unit 11413 of the CCU 11201 on the basis of the acquired image signal. In the latter case, so-called auto exposure (AE), auto focus (AF), and auto white balance (AWB) functions are provided in the endoscope 11100.

The camera head control unit 11405 controls driving of the camera head 11102 on the basis of a control signal from the CCU 11201 received via the communication unit 11404.

The communication unit 11411 includes a communication device for transmitting and receiving various types of information to and from the camera head 11102. The communication unit 11411 receives the image signal transmitted from the camera head 11102 via the transmission cable 11400.

Further, the communication unit 11411 transmits the control signal for controlling the driving of the camera head 11102 to the camera head 11102. The image signal or the control signal can be transmitted through electric communication, optical communication, or the like.

The image processing unit 11412 performs various types of image processing on the image signal that is the RAW data transmitted from the camera head 11102.

The control unit 11413 performs various controls regarding imaging of the surgical site or the like by the endoscope 11100 and a display of a captured image obtained by imaging the surgical site or the like. For example, the control unit 11413 generates the control signal for controlling the driving of the camera head 11102.

Further, the control unit 11413 causes the display device 11202 to display the captured image of the surgical site or the like on the basis of the image signal subjected to the image processing in the image processing unit 11412. In this case, the control unit 11413 may recognize various Objects in the captured image using various image recognition techniques. For example, the control unit 11413 can detect a shape, color, or the like of edges of the object included in the captured image to recognize surgical tools such as forceps, a specific living body portion, bleeding, a mist when the energy treatment tool 11112 is used, or the like. When the control unit 11413 causes the captured image to be displayed on the display device 11202, the control unit 11413 may cause various types of surgery assistance information to be superimposed on the image of the surgical site and displayed using a result of the recognition. Superimposing and displaying the surgery assistance information and presenting the surgery assistance information to the surgeon 11131 makes it possible to reduce a burden on the surgeon 11131 and for the surgeon 11131 to reliably proceed with the surgery.

The transmission cable 11400 that connects the camera head 11102 and the CCU 11201 is an electrical signal cable compatible with communication of electrical signals, an optical fiber compatible with optical communication, or a composite cable of these.

Here, although wired communication is performed using the transmission cable 11400 in the illustrated example, communication between the camera head 11102 and the CCU 11201 may be performed wirelessly.

Although the endoscopic surgery system has been described herein by way of example, the technology according to the present, disclosure may be applied to other systems such as a microscopic surgery system or the like.

Example of Application to Mobile Body

Further, for example, the technology according to the present disclosure may be realized as a device mounted in any type of a moving body such as an automobile, an electric vehicle, a hybrid electric vehicle, a motorcycle, a bicycle, a personal mobility, an airplane, a drone, a ship, and a robot.

FIG. 23 is a block diagram illustrating a schematic configuration example of a vehicle control system that is an example of a mobile body control system to which the technology according to the present disclosure can be applied.

A vehicle control system 12000 includes a plurality of electronic control units connected via a communication network 12001. In the example illustrated in FIG. 23, the vehicle control system 12000 includes a drive system control unit 12010, a body system control unit 12020, an outside-vehicle information detection unit 12030, an inside-vehicle information detection unit 12040, and an integrated control unit 12050. Further, a microcomputer 12051, an audio and image output unit 12052, and an in-vehicle network interface (I/F) 12053 are shown as a functional configuration of the integrated control unit 12050.

The drive system control unit 12010 controls an operation of devices relevant to a drive system of a vehicle according to various programs. For example, the drive system control unit 12010 functions as a control device for a drive force generation device for generating a drive force of a vehicle, such as an internal combustion engine or a drive motor, a drive force transmission mechanism for transmitting the drive force to wheels, a steering mechanism for adjusting a steering angle of the vehicle, a braking device that generates the braking force of the vehicle, and the like.

The body system control unit 12020 controls operations of various devices mounted in a vehicle body according to various programs. For example, the body system control unit 12020 functions as a keyless entry system, a smart key system, a power window device, or a control device for various lamps such as a head lamp, a back lamp, a brake lamp, a blinker, or a fog lamp. In this case, radio waves transmitted from a portable device that substitutes for a key or signals of various switches can be input to the body system control unit 12020. The body system control unit 12020 receives input of the radio waves or signals and controls a door lock device, a power window device, a lamp, and the like of the vehicle.

The outside-vehicle information detection unit 12030 detects information on the outside of the vehicle in which the vehicle control system 12000 has been mounted. For example, the imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform an object detection process or a distance detection process such as people, vehicles, obstacles, signs, or characters on road surfaces on the basis of the received image.

The imaging unit 12031 is an optical sensor that receives light and outputs an electrical signal according to the amount of received light. The imaging unit 12031 can output the electrical signal as an image or can output the electrical signal as distance measurement information. Further, the light received by the imaging unit 12031 may be visible light or may be invisible light such as infrared rays.

The inside-vehicle information detection unit 12040 detects information on the inside of the vehicle. A driver state detection unit 12041 that detects a state of a driver, for example, is connected to the inside-vehicle information detection unit 12040. The driver state detection unit 12041 includes, for example, a camera that images the driver, and the inside-vehicle information detection unit 12040 may calculate a degree of fatigue or a degree of concentration of the driver on the basis of detection information input from the driver state detection unit 12041 or may determine whether or not the driver is drowsing.

The microcomputer 12051 can calculate a control target value of the driving force generation device, the steering mechanism, or the braking device on the basis of the information on the inside or the outside of the vehicle acquired by the outside-vehicle information detection unit 12030 or the inside-vehicle information detection unit 12040, and output a control command to the drive system control unit 12010. For example, the microcomputer 12051 can perform cooperative control for the purpose of realization of functions of an advanced driver assistance system (ADAD) including collision avoidance or impact mitigation of a vehicle, follow-up traveling based on an inter-vehicle distance, vehicle speed keeping traveling, a vehicle collision warning, a vehicle lane departure warning, and the like.

Further, the microcomputer 12051 can control the driving force generation device, the steering mechanism, the braking device, or the like on the basis of information on the vicinity of the vehicle acquired by the outside-vehicle information detection unit 12030 or the inside-vehicle information detection unit 12040, to thereby perform cooperative control for the purpose of, for example, autonomous driving in which the vehicle autonomously travels without depending on an operation of the driver.

Further, the microcomputer 12051 can output a control command to the body system control unit 12020 on the basis of the information on the outside of the vehicle acquired by the outside-vehicle information detection unit 12030. For example, the microcomputer 12051 can control headlamps according to a position of a preceding vehicle or an oncoming vehicle detected by the outside-vehicle information detection unit 12030 to thereby perform cooperative control for the purpose of antiglare, such as switching from a high beam to a low beam.

The audio and image output unit 12052 transmits an output signal of at least one of an audio and an image to an output device capable of notifying an occupant of the vehicle or the outside of the vehicle of information visually or audibly. In the example of FIG. 23, an audio speaker 12061, a display unit 12062, and an instrument panel 12063 are illustrated as examples of the output device. The display unit 12062 may include at least one of an on-board display and a head-up display, for example.

FIG. 24 is a diagram illustrating an example of an installation position of the imaging unit 12031.

In FIG. 24, the imaging unit 12031 includes imaging units 12101, 12102, 12103, 12104, and 12105.

The imaging units 12101, 12102, 12103, 12104, and 12105 are provided in positions such as a front nose, side mirrors, a rear bumper, and a back door of the vehicle 12100, and an upper portion of a windshield inside the vehicle. The imaging unit 12101 included in the front nose and the imaging unit 12105 included in the upper portion of the windshield inside the vehicle mainly acquire an image of an area in front of the vehicle 12100. The imaging units 12102 and 12103 included in the side mirrors mainly acquire images of areas on the sides of the vehicle 12100. The imaging unit 12104 included in the rear bumper or the back door mainly acquires an image of an area behind the vehicle 12100. The imaging unit 12105 included in the upper portion of the windshield inside the vehicle is mainly used for detection of a preceding vehicle, a pedestrian, an obstacle, a traffic signal, a traffic sign, a lane, or the like.

Examples of imaging ranges of the imaging units 12101 to 12104 are illustrated in FIG. 24. An imaging range 12111 indicates an imaging range of the imaging unit 12101 provided on the front nose, imaging ranges 12112 and 12113 indicate imaging ranges of the imaging units 12102 and 12103 provided in the side mirrors, and an imaging range 12114 indicates an imaging range of the imaging unit 12104 provided in the rear bumper or the back door. For example, a bird's-eye view image of the vehicle 12100 viewed from above can be obtained by overlaying image data captured by the imaging units 12101 to 12104.

At least one of the imaging units 12101 to 12104 may have a function of acquiring distance information. For example, at least one of the imaging units 12101 to 12104 may be a stereo camera including a plurality of image sensors or may be an image sensor having pixels for phase difference detection.

For example, the microcomputer 12051 can obtain a distance to each three-dimensional object within the imaging ranges 12111 to 12114 and a temporal change in this distance (a relative speed with respect to the vehicle 12100) on the basis of the distance information obtained from the imaging units 12101 to 12104, to thereby extract, as the preceding vehicle, particularly, a closest three-dimensional object on a traveling path of the vehicle 12100, which is a three-dimensional object, traveling in the substantially same direction as that of the vehicle 12100 at a predetermined speed (for example, 0 km/h or more). Further, the microcomputer 12051 can set an inter-vehicle distance to be secured in advance before the preceding vehicle and perform automatic braking control (including follow-up stop control), automatic acceleration control (including follow-up start control), and the like. Thus, it is possible to perform cooperative control for the purpose of, for example, autonomous driving in which the vehicle autonomously travels without depending on an operation of the driver.

For example, the microcomputer 12051 can classify three-dimensional object data regarding a three-dimensional object into other three-dimensional objects such as a two-wheeled vehicle, an ordinary vehicle, a large vehicle, a pedestrian, and a utility pole on the basis of the distance information obtained from the imaging units 12101 to 12104, extract the three-dimensional object data, and use the three-dimensional object data for automatic avoidance of obstacles. For example, the microcomputer 12051 identifies obstacles around the vehicle 12100 as obstacles visible to the driver of the vehicle 12100 and obstacles difficult to view. The microcomputer 12051 can determine a collision risk indicating a degree of risk of collision with each obstacle, and can output a warning to the driver via the audio speaker 12061 or the display unit 12062 or perform forced deceleration or avoidance steering via the drive system control unit 12010 when the collision risk is equal to or higher than a set value and collision is likely to occur, to thereby perform driving assistance for collision avoidance.

At least one of the imaging units 12101 to 12104 may be an infrared camera that detects infrared rays. For example, the microcomputer 12051 can determine whether or not a pedestrian is present in the captured images of the imaging units 12101 to 12104 to recognize the pedestrian. Such recognition of the pedestrian is performed using, for example, a procedure for extracting feature points in the captured images of the imaging units 12101 to 12104 serving as infrared cameras, and a procedure for performing a pattern matching process on a series of feature points indicating a contour of an object to determine whether the object is a pedestrian. When the microcomputer 12051 determines that the pedestrian is present in the captured of images of the imaging units 12101 to 12104 and recognizes the pedestrian, the audio and image output unit 12052 controls the display unit 12062 so that the display unit 12062 displays the recognized pedestrian with a rectangular contour line for highlighting superimposed thereon. Further, the audio and image output unit 12052 may control the display unit 12062 so that the display unit 12062 displays, for example, an icon indicating a pedestrian in a desired position.

Embodiments of the present technology are not limited to the embodiments described above, and various modifications can be made without departing from the gist of the present, technology.

The present technology can also be configured as follows.

(1)

An image sensor comprising:

a substrate;

a first pixel including a first photoelectric conversion area provided in the substrate;

a second pixel including a second photoelectric conversion area adjacent to the first photoelectric conversion area and provided in the substrate;

a trench provided in the substrate between the first photoelectric conversion area and the second photoelectric conversion area;

a first area included in the first pixel;

a second area included in the second pixel; and a third area in contact with the first area, the second area, and the trench.

(2)

The image sensor according to (1), wherein the first area, the second area, and the third area are N-type impurity areas or P-type impurity areas.

(3)

The image sensor according to (1) or (2), wherein the first area, the second area, and the third area are areas at the same potential.

(4)

The image sensor according to any one of (1) to (3), wherein the first area and second area are floating diffusions (FDs).

(5)

The image sensor according to any one of (1) to (4), wherein the first area and the second area are ground areas.

(6)

The image sensor according to any one of (1) to (5), wherein the third area is formed of polysilicon containing N-type or P-type impurities with respect to the substrate.

(7)

The image sensor according to any one of (1) to (6), wherein two of side surfaces and a bottom surface of the third area are in contact with a predetermined film formed in the trench.

(8)

The image sensor according to any one of (1) to (7), wherein a wiring connected to a transistor is connected to the third area.

(9)

The image sensor according to any one of (1) to (8), wherein a depth of the third area is 50% to 80% of a depth of the first area.

(10)

The image sensor according to any one of (1) to (9), wherein the first area is formed to have the same size as or to be larger than the third area in a portion in which the first area and the third area are in contact with each other.

(11)

The image sensor according to any one of (1) to (10), wherein the third area is in contact with the first area on two sides.

(12)

The image sensor according to any one of (1) to (7), wherein a wiring connected to a transistor is connected to the first area, and the first area is formed as an area larger than the second area.

(13)

The image sensor according to any one of (1) to (12), wherein a PN junction area including a P-type area and an N-type area is formed on a sidewall of the trench.

(14)

An electronic device comprising an image sensor, the image sensor including:

a substrate;

a first pixel including a first photoelectric conversion area provided in the substrate;

a second pixel including a second photoelectric conversion area adjacent to the first photoelectric conversion area and provided in the substrate;

a trench provided in the substrate between the first photoelectric conversion area and the second photoelectric conversion area;

a first area included in the first pixel;

a second area included in the second pixel; and a third area in contact with the first area, the second area, and the trench.

REFERENCE SIGNS LIST

50 Pixel
70 Si substrate
72 P-type area
73 Flattening film
74 Light shielding film
75 Back surface Si interface
77 Active area
79 FD wiring
83 P-type solid phase diffusion layer
84 N-type solid phase diffusion layer
85 Sidewall film.
86 Filling material
90 Transfer transistor
91 FD
92 Reset transistor
93 Amplification transistor
94 Selection transistor
95 Conversion efficiency switching transistor
96 GND contact
97 Connection portion
98 FD wiring
99 SiO2 film
201 GND area

What is claimed is:

1. An image sensor, comprising:

a substrate;

a first pixel including a first photoelectric conversion area provided in the substrate;

a second pixel including a second photoelectric conversion area adjacent to the first photoelectric conversion area and provided in the substrate;

a trench provided in the substrate between the first photoelectric conversion area and the second photoelectric conversion area;

a first area included in the first pixel;

a second area included in the second pixel; and a third area in contact with the first area, the second area, and the trench, wherein two side surfaces and a bottom surface of the third area are in contact with and extend within a predetermined film formed in the trench, wherein the first area and the second area are in contact with two other side surfaces of the third area, wherein the first area and the second area are floating diffusions (FDs), wherein the third area is formed of polysilicon containing N-type or P-type impurities with respect to the substrate, and wherein the predetermined film includes a silicon dioxide film.

2. The image sensor according to claim 1, wherein the first area, the second area, and the third area are N-type impurity areas or P-type impurity areas.

3. The image sensor according to claim 1, wherein the first area, the second area, and the third area are areas configured to be biased at the same potential.

4. The image sensor according to claim 1, wherein the first area and the second area are ground areas.

5. The image sensor according to claim 1, wherein the two side surfaces and the bottom surface of the third area form an arc shape.

6. The image sensor according to claim 1, wherein a wiring connected to a transistor is connected to the third area.

7. The image sensor according to claim 1, wherein a depth of the third area is 50% to 80% of a depth of the first area.

8. The image sensor according to claim 1, wherein the first area is formed to have the same size as or to be larger than the third area in a portion in which the first area and the third area are in contact with each other.

9. The image sensor according to claim 1, wherein the third area is in contact with the first area on two sides.

10. The image sensor according to claim 1, wherein a wiring connected to a transistor is connected to the first area, and wherein the first area is formed as an area larger than the second area.

11. The image sensor according to claim 1, wherein a PN junction area including a P-type area and an N-type area is formed on a sidewall of the trench.

12. An electronic device, comprising:

an optical system;

an image sensor that receives light from the optical system, the image sensor including:

a substrate;

a first pixel including a first photoelectric conversion area provided in the substrate;

a second pixel including a second photoelectric conversion area adjacent to the first photoelectric conversion area and provided in the substrate;

a trench provided in the substrate between the first photoelectric conversion area and the second photoelectric conversion area;

a first area included in the first pixel;

a second area included in the second pixel; and a third area in contact with the first area, the second area, and the trench, wherein two side surfaces and a bottom surface of the third area are in contact with and extend within a predetermined film formed in the trench, wherein the first area and the second area are in contact with two other side surfaces of the third area, wherein the first area and the second area are floating diffusions (FDs), wherein the third area is formed of polysilicon containing N-type or P-type impurities with respect to the substrate, and wherein the predetermined film includes a silicon dioxide film; and a digital signal processor that possesses signal received from the image sensor.

13. The electronic device according to claim 12, wherein the first area, the second area, and the third area are N-type impurity areas or P-type impurity areas.

14. The electronic device according to claim 12, wherein the first area, the second area, and the third area are areas configured to be biased at the same potential.

15. The electronic device according to claim 12, wherein the first area and the second area are ground areas.

16. The electronic device according to claim 12, wherein the two side surfaces and the bottom surface of the third area form an arc shape.

* * * * *